US012763022B2

(12) United States Patent
Shin et al.

(10) Patent No.: US 12,763,022 B2
(45) Date of Patent: Oct. 13, 2026

(54) DISPLAY DEVICE

(71) Applicant: LG Display Co., Ltd., Seoul (KR)

(72) Inventors: Sang-Il Shin, Paju-si (KR); ChoongHoon Lee, Paju-si (KR); Youngju Park, Paju-si (KR); ChangYoon Yang, Paju-si (KR); Hoyeon Yang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 19/188,782

(22) Filed: Apr. 24, 2025

(65) Prior Publication Data

US 2025/0336357 A1 Oct. 30, 2025

(30) Foreign Application Priority Data

Apr. 25, 2024 (KR) ........................ 10-2024-0055681

(51) Int. Cl.
*G09G 3/3233* (2016.01)
*H10K 59/123* (2023.01)
*H10K 59/88* (2023.01)

(52) U.S. Cl.
CPC ......... *G09G 3/3233* (2013.01); *H10K 59/123* (2023.02); *H10K 59/88* (2023.02); (Continued)

(58) Field of Classification Search
CPC ......... G09G 3/3233; G09G 2300/0426; G09G 2300/0452; G09G 2300/0465; G09G 2300/0819; G09G 2300/0852; G09G 2300/0861; G09G 2310/0289; G09G 2320/0233; G09G 2320/0242; G09G 2320/041; G09G 2320/0666; G09G 2330/023; H10D 30/6755; H10K 59/12; H10K 59/1213; H10K 59/123; H10K 59/131; H10K 59/35; H10K 59/352; H10K 59/88
See application file for complete search history.

(56) References Cited

U.S. PATENT DOCUMENTS

2015/0129856 A1 5/2015 Kim et al.
2022/0231113 A1 7/2022 Xu et al.
(Continued)

FOREIGN PATENT DOCUMENTS

CN 106898298 A 6/2017
CN 116247065 A 6/2023
(Continued)

*Primary Examiner* — Nelson M Rosario
(74) *Attorney, Agent, or Firm* — Birch, Stewart, Kolasch & Birch, LLP

(57) ABSTRACT

A display device including a first subpixel including a first light-emitting element configured to emit light of a first color and a first driving transistor configured to drive the first light-emitting element, a second subpixel including a second light-emitting element configured to emit light of a second color and a second driving transistor configured to drive the second light-emitting element, at least one first dummy hole disposed in the first driving transistor, and at least one second dummy hole disposed in the second driving transistor. Further, a total aperture area of the at least one first dummy hole of the first driving transistor is different than a total aperture area of the at least one second dummy hole of the second driving transistor.

19 Claims, 16 Drawing Sheets

(52) U.S. Cl.
CPC ............... *G09G 2300/0426* (2013.01); *G09G 2300/0452* (2013.01); *G09G 2300/0465* (2013.01); *G09G 2300/0819* (2013.01); *G09G 2300/0852* (2013.01); *G09G 2300/0861* (2013.01); *G09G 2310/0289* (2013.01); *G09G 2320/0233* (2013.01); *G09G 2320/0242* (2013.01); *G09G 2320/041* (2013.01); *G09G 2320/0666* (2013.01); *G09G 2330/023* (2013.01)

(56) References Cited

U.S. PATENT DOCUMENTS

| | | | | |
|---|---|---|---|---|
| 2023/0052275 | A1* | 2/2023 | Lim | H10K 59/38 |
| 2023/0157070 | A1 | 5/2023 | Yang | |
| 2024/0049521 | A1 | 2/2024 | Yang et al. | |
| 2025/0113705 | A1* | 4/2025 | Wu | H10K 59/1216 |
| 2025/0311605 | A1* | 10/2025 | Lee | H10K 59/88 |
| 2025/0336357 | A1 | 10/2025 | Shin et al. | |

FOREIGN PATENT DOCUMENTS

| | | | |
|---|---|---|---|
| JP | 2025-168325 | A | 11/2025 |
| KR | 10-2022-0096626 | A | 7/2022 |
| KR | 10-2024-0159079 | A | 11/2024 |
| WO | WO 2022/004919 | A1 | 1/2022 |

* cited by examiner

31 : 103, 104

DISPLAY DEVICE

CROSS-REFERENCE TO RELATED APPLICATIONS

This application claims priority to Korean Patent Application No. 10-2024-0055681, filed in the Republic of Korea on Apr. 25, 2024, the entire contents of which is hereby expressly incorporated by reference into the present application

BACKGROUND

Field of the Invention

The present disclosure relates to a display device capable of reducing a luminance and a color coordinate variation due to a temperature variation.

Discussion of the Related Art

Electroluminescence display devices have the advantages of high brightness, low operating voltage, ultra-thin film, and freedom of shape implementation by utilizing self-luminous elements. However, the luminance of the light-emitting element included in the display device changes depending on temperature changes.

SUMMARY

The inventors have recognized that, in electroluminescence display devices, red, green, and blue light-emitting elements with different light-emitting materials have different luminance variation characteristics depending on temperature, and thus, differences in luminance variation can occur between three color subpixels depending on temperature fluctuation. As a result, the white color coordinates of the electroluminescence display device can fluctuate depending on the temperature fluctuation, which can deteriorate the optical quality.

Accordingly, the present disclosure is directed to providing a display device that substantially obviate one or more problems due to limitations and disadvantages of the related art.

In one aspect, the present disclosure provides an improved display device by reducing a luminance and a color coordinate variation due to a temperature variation.

Additional advantages and features of the disclosure will be set forth in part in the description which follows and in part will become apparent to those having ordinary skill in the art upon examination of the following or can be learned from practice of the disclosure. The technical benefits and other advantages of the disclosure can be realized and attained by the structure particularly pointed out in the written description and claims hereof as well as the appended drawings.

To achieve these and other benefits and in accordance with the purpose of the disclosure, as embodied and broadly described herein, the present disclosure provides a display device having a first subpixel including a first light-emitting element configured to emit light of a first color and a first driving transistor configured to drive the first light-emitting element, and a second subpixel including a second light-emitting element configured to emit light of a second color and a second driving transistor configured to drive the second light-emitting element. Further, an area of a dummy hole of the first driving transistor and an area of a dummy hole of the second driving transistor have different area ratios.

In accordance with another aspect of the present disclosure, the present disclosure provides a display device having a first subpixel including a first light-emitting element configured to emit light of a first color, a first driving transistor configured to drive the first light-emitting element, and a first dummy hole overlapping a first gate electrode of the first driving transistor. The display device also includes a second subpixel including a second light-emitting element configured to emit light of a second color, a second driving transistor configured to drive the second light-emitting element, and a second dummy hole overlapping a second gate electrode of the second driving transistor. Further, the display device includes a third subpixel including a third light-emitting element configured to emit light of a third color, a third driving transistor configured to drive the third light-emitting element, and a third dummy hole overlapping a third gate electrode of the third driving transistor. In addition, an area of the first dummy hole has a different area ratio from each of an area of the second dummy hole and an area of the third dummy hole, and the area of the second dummy hole is the same as or different from the area of the third dummy hole.

In accordance with another aspect of the present disclosure, the present disclosure provides a display device having a first subpixel including a first light-emitting element configured to emit light of a first color, a first driving transistor configured to drive the first light-emitting element, and a first dummy hole overlapping the first driving transistor, and a second subpixel including a second light-emitting element configured to emit light of a second color, a second driving transistor configured to drive the second light-emitting element, and a second dummy hole overlapping the second driving transistor. Further, the first driving transistor and the second driving transistor have different dummy hole area ratios depending on the temperature dependent luminance variation characteristics of the first light-emitting element and the second light-emitting element.

In accordance with another aspect of the present disclosure, the present disclosure provides a display device having a first subpixel including a first light-emitting element configured to emit light of a first color, a first driving transistor configured to drive the first light-emitting element, and a first dummy hole overlapping the first driving transistor, and a second subpixel including a second light-emitting element configured to emit light of a second color, a second driving transistor configured to drive the second light-emitting element, and a second dummy hole overlapping the second driving transistor, wherein the first driving transistor and the second driving transistor have different dummy hole area ratios depending on the aperture ratios of the first light-emitting element and the second light-emitting element.

It is to be understood that both the foregoing general description and the following detailed description of the present disclosure are exemplary and explanatory and are intended to provide further explanation of the disclosure

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
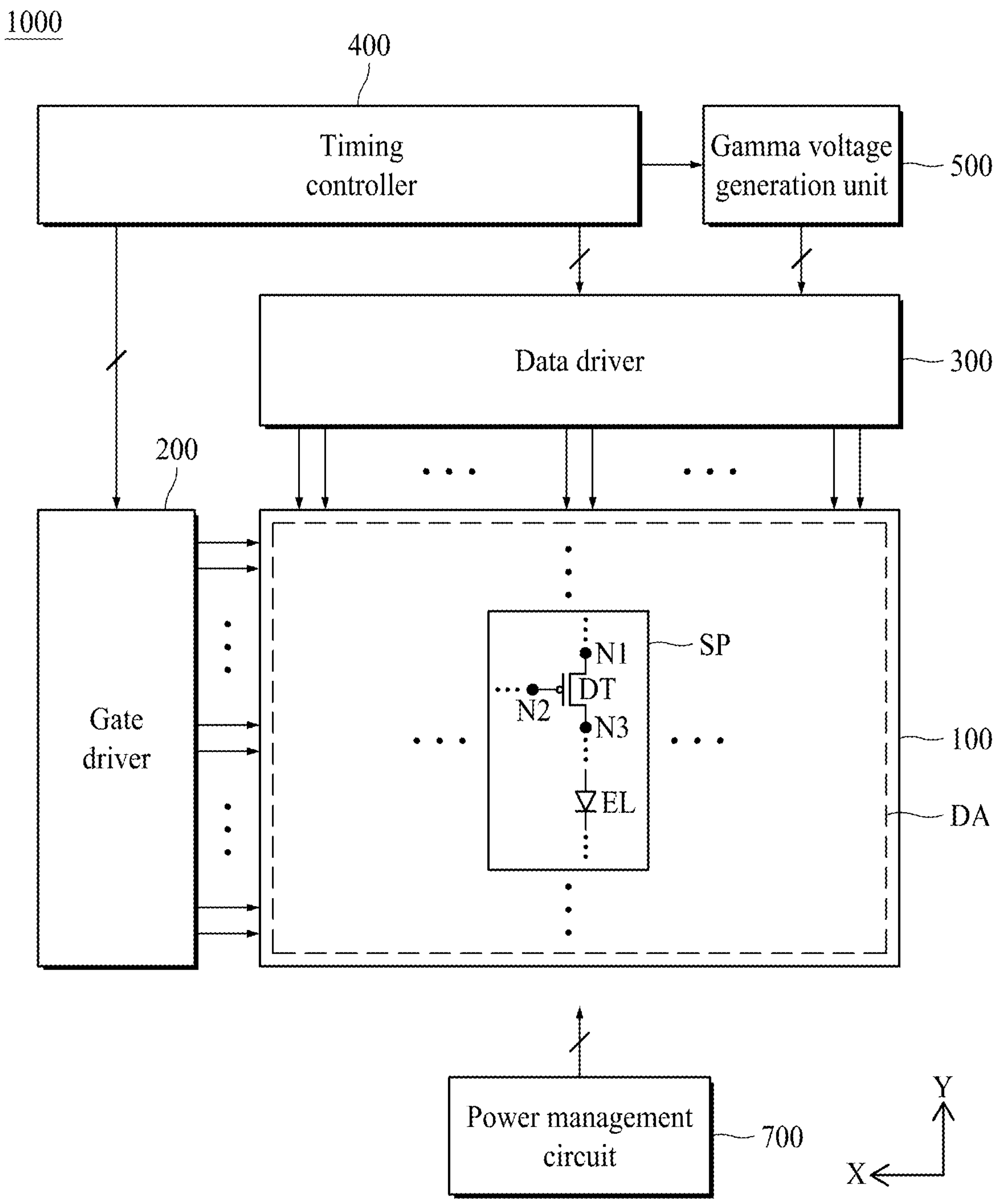
FIG. 1 is a block diagram schematically illustrating a display device according to one embodiment of the present disclosure.

Advantages and features of the present disclosure, and implementation methods thereof will be clarified through the following embodiments, described with reference to the accompanying drawings. The present disclosure can, however, be embodied in different forms and should not be construed as being limited to the embodiments set forth herein. Rather, these embodiments are provided so that this disclosure will be thorough and complete, and will fully convey the scope of the present disclosure to those skilled in the art.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted or briefly described.

When "comprise," "contain," "have," and "include" described in the present specification are used, another part can also be present unless a term such as "merely", "only", etc. is used. The terms in a singular form can include plural forms unless noted to the contrary. In construing an element, the element is construed as including an error region or tolerance region although there is no explicit description thereof. In describing a positional relationship, for example, when the positional order is described as "on," "above," over," "upper," "lower" "under," "below," "beneath," "beside" or "next to," the case of no contact therebetween can be included, unless a term such as "just" or "directly" is used.

If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration. In describing a temporal relationship, for example, when the temporal order is described as "after," "subsequent," "following," "next," and "before," or the like, a case which is not continuous can be included, unless a term such as "immediately", "just" or "directly" is used.

Although the terms "first," "second," "A," "B," "a," "b," etc., can be used herein to describe various elements, these elements are not limited by these terms. These terms are only used to distinguish one element from another. For example, a first element could be termed a second element, and, similarly, a second element could be termed a first element.

Also, the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically. The embodiments of the present disclosure can be carried out independently from each other, or can be carried out together in a co-dependent relationship.

Hereinafter, the aspect of the present disclosure will be described with reference to the accompanying drawings. Because a scale of each of elements shown in the accompanying drawings is different from an actual scale for convenience of description, the present disclosure is not limited to the shown scale. Further, all the components of each display apparatus, display device, and display panel according to all aspects of the present disclosure are operatively coupled and configured.

FIG. 1 is a block diagram schematically illustrating a display device according to one embodiment of the present disclosure. The display device can be an electroluminescence display device including any one of an organic light emitting diode OLED display device, a quantum-dot light emitting diode QD display device, a micro light emitting diode (micro LED), a mini light emitting diode (mini LED), and an inorganic light emitting diode ILD display device, but is not limited thereto.

Referring to FIG. 1, a display device 1000 includes a display panel 100, a gate driver 200, a data driver 300, a timing controller 400, a gamma voltage generation unit 500, and a power management circuit 700, but not limited thereto. More or less components may be included in the display device. The gate driver 200 and the data driver 300 can be integrated and expressed as a panel driver that drives the display panel 100. Also, the gate driver 200, the data driver 300, the timing controller 400, the gamma voltage generation unit 500, and the power management circuit 700 can be collectively referred to as a display driver.

In addition, the display panel 100 can be a rigid display panel or a flexible display panel capable of changing shape, such as a foldable, bendable, rollable, or stretchable display panel. The display panel 100 can also display an image through a pixel array in which subpixels SP are arranged in a matrix form in the display area DA. The display panel 100 can further include a touch sensor array arranged in the display area DA to sense a user's touch.

Further, the pixel arranged in a display area DA can include a plurality of subpixels SP configured to emit light of different colors to implement white light. The subpixels SP can include a red R subpixel that emits red light, a green G subpixel that emits green light, a blue B subpixel that emits blue light, and can further include a white W subpixel that emits white light.

Also, the subpixel SP can have a pixel circuit including a light-emitting element EL and a driving transistor DT that independently drives the light-emitting element EL. The light-emitting element EL can be any one of an organic light-emitting diode, a quantum dot light-emitting diode, a micro light emitting diode (micro LED), a mini light emitting diode (mini LED), and an inorganic light-emitting diode, but not limited thereto. In addition, the pixel circuit can have various circuit configurations including the driving transistor DT, a transistor connected to at least one of nodes N1, N2, N3 connected to the driving transistor DT, and a capacitor, but not limited thereto. The pixel circuit of the subpixel SP can also be connected to signal lines including a gate line, a data line, a power line, etc., arranged on a display panel 100.

In addition, the light-emitting elements EL can have luminance variation characteristics according to temperature, and thus can have high temperature luminance sensitivity (TLS). The R, G, and B light-emitting elements EL with different types of luminescent materials have different luminance variation characteristics according to temperature, and thus can have high temperature color sensitivity (TCS). The display panel 100 can control the luminance variation according to the temperature of the light-emitting element EL by controlling the threshold voltage variation amount ΔVth of the driving transistor DT according to the temperature.

In more detail, a threshold voltage variation amount ΔVth of the driving transistor DT can be changed depending on temperature by applying dummy holes to a plurality of insulating layers of the driving transistor DT in a subpixel SP. The dummy holes of the driving transistor DT can also be provided in the insulating layers in the same process together with contact holes so as to reduce process steps and simplify the manufacture procedure. Further, the dummy holes of the driving transistor DT can be used as passages through which hydrogen atoms in the plurality of insulating layers are discharged together with the contact holes in a heat treatment process to increase the degree of dehydrogenation, thereby increasing the threshold voltage variation amount ΔVth of the driving transistor DT depending on temperature.

Accordingly, the display panel 100 can reduce or minimize the temperature luminance sensitivity TLS and temperature color sensitivity TCS of subpixels SP by suppressing the temperature-dependent luminance variation of the light-emitting element EL through an increase in the threshold voltage variation amount ΔVth of the driving transistor DT according to temperature.

In addition, the number or area ratio (aperture ratio or aperture area) of dummy holes to the driving transistor DT can be based on the aperture ratio (aperture area) or light-emitting area of the light-emitting element EL or the luminance variation characteristics of the light-emitting element EL depending on temperature, thereby controlling the threshold voltage variation amount ΔVth of the driving transistor DT differently. A detailed description of this is provided later.

Accordingly, the display panel 100 can reduce or minimize the difference in luminance variation due to temperature variation between subpixels SP by controlling the threshold voltage variation amount ΔVth of the driving transistor DT in at least two subpixels SP of different colors differently. Thus, the variation in white color coordinates caused by temperature variation can be reduced or minimized, thereby improving the optical quality of the display panel 100.

Further, the gate driver 200 is controlled according to a plurality of gate control signals supplied from a timing controller 400 and can individually drive the gate lines of the display panel 100. The gate driver 200 can also supply a gate-on voltage to each gate line during a driving period of each gate line, and supply a gate-off voltage to the corresponding gate line during a non-driving period of each gate line. Also, the gate driver 200 can be built into the bezel area of the display panel 100 in the form of a gate in panel GIP formed together with thin film transistors of the display area DA.

In addition, the gate driver 200 built into a display panel 100 can receive a plurality of gate control signals from the timing controller 400 through a level shifter. In particular, the level shifter can receive timing control signals from the timing controller 400 and level-shift or logic process the signals to generate a plurality of gate control signals to supply to the gate driver 200.

Further, the gamma voltage generation unit 500 can generate a plurality of reference gamma voltages having different gamma voltage levels and supply them to the data driver 300. In more detail, the gamma voltage generation unit 500 can generate a plurality of reference gamma voltages corresponding to the gamma characteristics of the display device 1000 under the control of the timing controller 400 and supply the voltages to the data driver 300. The gamma voltage generation unit 500 can also adjust the reference gamma voltage level according to the gamma data supplied from the timing controller 400 and output it to the data driver 300. In addition, the gamma voltage generation unit 500 can adjust a high-potential power supply voltage, which is a maximum gamma voltage, according to the peak luminance control from the timing controller 400, and can adjust a plurality of reference gamma voltages according to the adjusted high-potential power supply voltage and output them to the data driver 300.

Further, the data driver 300 can be controlled according to a plurality of data control signals supplied from the timing controller 400, and can convert digital data supplied from the timing controller 400 into an analog data signal using a digital-to-analog conversion circuit. Also, the data driver 300 can divide a plurality of reference gamma voltages supplied from the gamma voltage generation unit 500 into gamma voltages, and can convert digital data into the analog data signal using the divided gamma voltages. The data driver 300 can then supply the converted data signal to a data line of the display panel 100.

In addition, the data driver 300 can additionally supply a reference voltage to a reference line of the display panel 100 under the control of the timing controller 400. Also, the data driver 300 can supply the reference voltage separately for display and sensing under the control of the timing controller 400.

In addition, the data driver 300 can further include a sensing unit to sense a signal reflecting the driving characteristics of a subpixel SP through a reference line or a power line under the control of the timing controller 400 in a voltage sensing manner or a current sensing manner and transmit the sensing result to the timing controller 400.

Also, the timing controller 400 can receive data of a source image and timing control signals from an external host system. Further, the host system can be any one of a computer, a TV system, a set-top box, a system of a portable terminal such as a tablet or a mobile phone, and an internal system of a vehicle. The timing control signals can include a dot clock, a data enable signal, a vertical synchronization signal, a horizontal synchronization signal, and the like.

In addition, the timing controller 400 can control the gate driver 200 and the data driver 300 using timing control signals supplied from the host system and timing setting information stored internally. Also, the timing controller 400 can generate a plurality of gate control signals for controlling the driving timing of the gate driver 200 and supply them to the gate driver 200. The timing controller 400 can also generate a plurality of data control signals for controlling the driving timing of the data driver 300 and supply them to the data driver 300. In addition, the timing controller 400 can be expressed as a controller. The timing controller 400 can also perform at least one of various image processing operations, including image quality correction, deterioration correction, and luminance correction for reducing power consumption, on input image data supplied from a host system.

In addition, the timing controller 400 can additionally compensate for the characteristic deviation of the subpixels SP stored in the memory before supplying the image processed data to the data driver 300. In addition, the timing controller 400 can perform a sensing mode according to a request from a host system or a user or a set driving sequence. The timing controller 400 can control the panel driver 200, 300 and the power management circuit 700 to drive the display panel 100 in the sensing mode and update compensation data stored in the memory. In the sensing mode, the timing controller 400 can sense the threshold voltage and mobility of the driving transistor DT that reflect the characteristics or deterioration of the subpixel SP of the display panel 100 through the data driver 300, and can further sense the threshold voltage of the light-emitting element EL. The timing controller 400 can then process the sensing result and update the compensation data of the subpixel SP.

In addition, the timing controller 400 can accumulate image data of subpixels SP to predict deterioration of the subpixels SP, and update compensation data by sensing threshold voltages of light-emitting elements EL for subpixels SP for which relatively large deterioration is predicted. Further, the power management circuit 700 can generate and supply various driving voltages necessary for the operation of all components of the display device 1000, including the display panel 100, gate driver 200, data driver 300, timing controller 400, and gamma voltage generator 500, by using the input voltage.

Figure 2A:
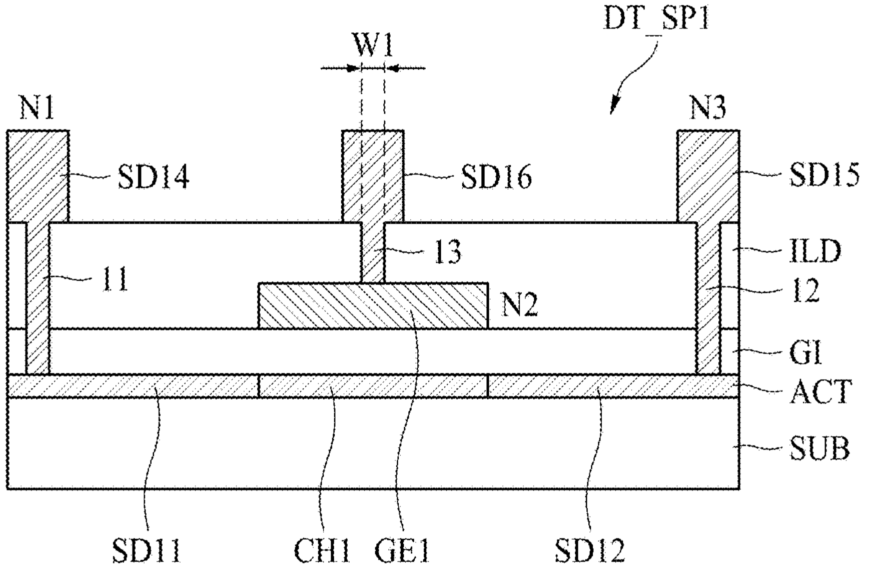
FIGS. 2A and 2B are overviews illustrating a driving transistor structure having a dummy hole according to one embodiment of the present disclosure.

Next, FIGS. 2A to 4C are drawings illustrating a driving transistor structure having a dummy hole according to one embodiment of the present disclosure. Referring to FIGS. 2A and 3A, a first driving transistor DT_SP1 of a first subpixel according to an embodiment can include an active layer ACT on a substrate SUB, a gate insulating layer GI on the active layer ACT, a gate electrode GE1 on the gate insulating layer GI, a first source/drain electrode SD11 and a second source/drain electrode SD12 provided as conductive regions facing each other with a channel CH1 interposed therebetween in the active layer ACT. The first driving transistor DT_SP1 is disposed on a plurality of insulating layers including an interlayer insulating layer ILD on the gate electrode GE1, and can further include a first source/drain connection electrode SD14 connected to the first source/drain electrode SD11 through a contact hole 11, and a second source/drain connection electrode SD15 connected to the second source/drain electrode SD12 through a contact hole 12.

Figure 2B:
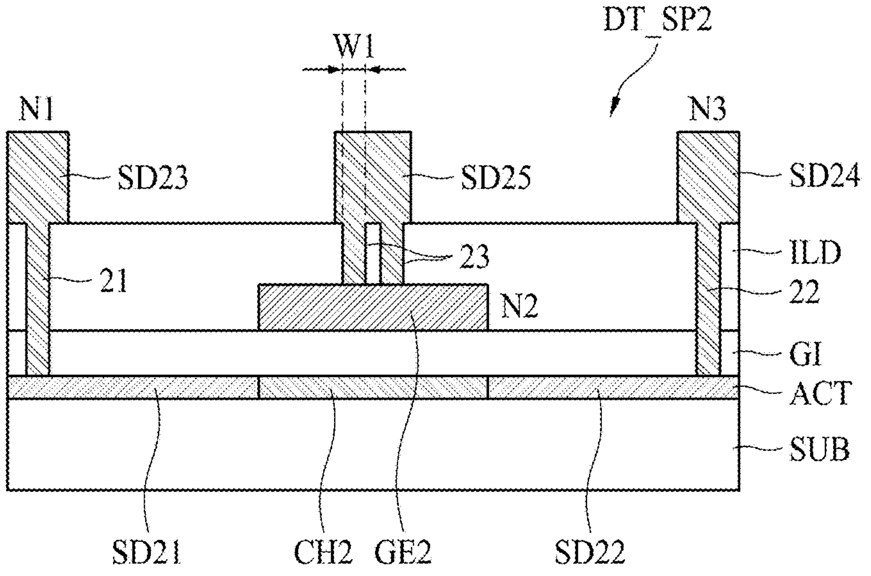
Figure 3A:
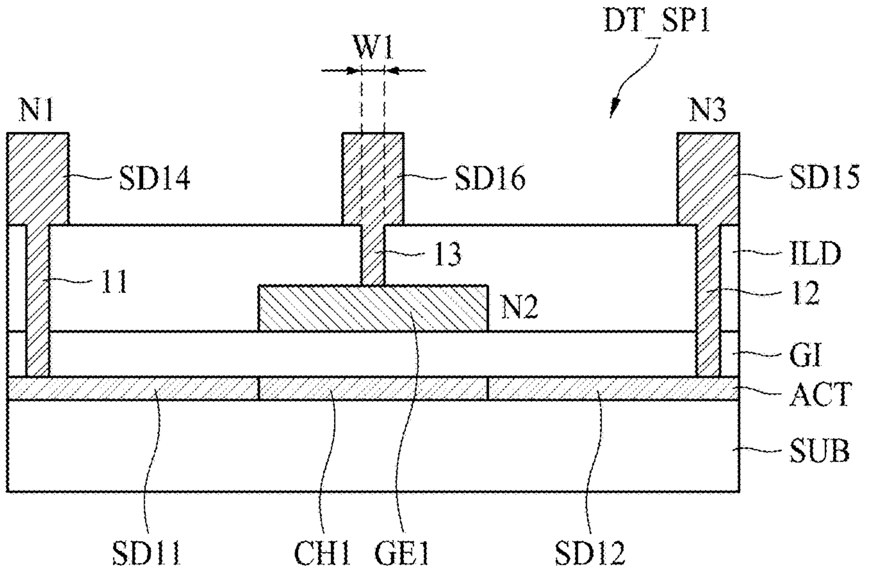
FIGS. 3A and 3B are overviews illustrating a driving transistor structure having a dummy hole according to another embodiment of the present disclosure.
Figure 3B:
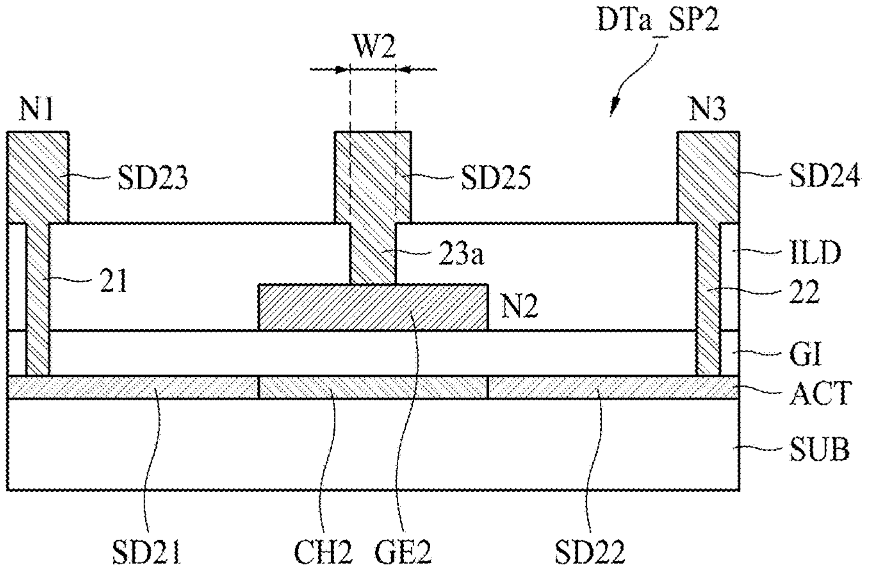

Referring to FIGS. 2B and 3B, a second driving transistors DT_SP2 or DTa_SP2 of a second subpixel according to one embodiment can include the active layer ACT on the substrate SUB, the gate insulating layer GI on the active layer ACT, a gate electrode GE2 on the gate insulating layer GI, the first source/drain electrode SD 21 and the second source/drain electrode SD22 provided as conductive regions facing each other with a channel CH2 interposed therebetween in the active layer ACT. The second driving transistor DT_SP2 or DTa_SP2 can further include a first source/drain connection electrode SD23 disposed on an interlayer insulating layer ILD and connected to the first source/drain electrode SD21 through a contact hole 21, and a second source/drain connection electrode SD24 connected to the second source/drain electrode SD22 through a contact hole 22.

In addition, the gate electrode GE1 of the first driving transistor DT_SP1 can be connected to a second node N2 of the first subpixel, the first source/drain electrode SD11 can be connected to a first node N1 of the first subpixel through the first source/drain connection electrode SD14, and the second source/drain electrode SD12 can be connected to a third node N3 of the first subpixel through the second source/drain connection electrode SD15. Also, the gate electrode GE2 of the second driving transistor DT_SP2 or DTa_SP2 can be connected to a second node N2 of the second subpixel, the first source/drain electrode SD21 can be connected to a first node N1 of the corresponding subpixel through the first source/drain connection electrode SD23, and the second source/drain electrode SD22 can be connected to a third node N3 of the second subpixel through the second source/drain connection electrode SD24.

As shown, contact holes 11 and 12 of the first driving transistor DT_SP1 and contact holes 21 and 22 of the second driving transistor DT_SP2 or DTa_SP2 can be provided through the insulating layers including the interlayer insulating layer ILD and the gate insulating layer GI. In addition, the first driving transistors DT_SP1 can further include dummy holes 13 provided in the insulating layers including the interlayer insulating layer ILD on the gate electrode GE1. Also, the second driving transistor DT_SP2 or DTa_SP2 can further include dummy hole 23 or 23*a* provided in the insulating layers including the interlayer insulating layer ILD on the gate electrodes GE2.

In addition, the dummy holes 13 and 23 or 23*a* of the driving transistors DT_SP1 and DT_SP2 or DTa_SP2 can be provided in the insulating layers including the interlayer insulating layer ILD in the same process as the contact holes 11, 12, 21, and 22. Further, the dummy holes 13 and 23 or 23*a*, together with the contact holes 11, 12, 21, and 22, can serve as passages for degassing by releasing hydrogen atoms from the insulating layers, including the interlayer insulating layer ILD in a heat treatment process after the contact hole process. Accordingly, the driving transistors DT_SP1 and DT_SP2 or DTa_SP2 can increase the threshold voltage variation amount ΔVth depending on the temperature by increasing the degree of dehydrogenation through the dummy holes 13 and 23 or 23*a*, and as a result, can reduce the temperature luminance sensitivity TLS and the temperature color sensitivity TCS of the first and second subpixels.

Furthermore, in the display device according to one embodiment, the aperture ratio, area, or a number of the dummy holes 13 and 23 or 23*a* can be differentially applied to the first and second driving transistors DT_SP1 and DT_SP2 or DTa_SP2 based on the aperture ratio or the light-emitting area of the light-emitting element or the luminance variation characteristics of the light-emitting element depending on temperature, thereby controlling the threshold voltage variation amount (ΔVth) of the first and second driving transistors DT_SP1 and DT_SP2 or DTa_SP2 differently according to temperature.

Referring to FIGS. 2A and 2B, the number of dummy holes 13 of the first driving transistor DT_SP1 of the first subpixel and the number of dummy holes 23 of the second driving transistor DT_SP2 of the second subpixel can be different. Further, each of the dummy holes 13, 23 can have the same width W1 and the same area as each of the contact holes 11, 12, 21, 22.

Also, the number of dummy holes 23 of the second driving transistor DT_SP2 illustrated in FIG. 2B can be greater than the number of dummy holes 13 of the first driving transistor DT_SP1 illustrated in FIG. 2A. For example, the first driving transistor DT_SP1 can include one dummy hole 13, and the second driving transistor DT_SP2 can include two dummy holes 23.

Referring to FIGS. 3A and 3B, the width W1 and area of the dummy hole 13 of the first driving transistor DT_SP1 of the first subpixel can be different from the width W2 and area of the dummy hole 23*a* of the second driving transistor DTa_SP2 of the second subpixel. For example, the width W2 and area of the dummy hole 23*a* of the second driving transistor DTa_SP2 illustrated in FIG. 3B can be larger than the width W1 and area of the dummy hole 13 of the first driving transistor DT_SP1 illustrated in FIG. 3A. Also, the width W2 and area of the dummy hole 23*a* of the second driving transistor DTa_SP2 can be larger than the width and area of each of the contact holes 21, 22 of the second driving transistor DTa_SP2.

Referring to FIGS. 2A to 3B, the driving transistors DT_SP1, DT_SP2, and DTa_SP2 according to one embodiment can further include dummy electrodes SD16 and SD25 disposed on the insulating layers including the interlayer insulating layer ILD and connected to gate electrodes GE1 and GE2 through dummy holes 13, 23, and 23*a*. The dummy electrodes SD 16 and SD25 are electrically floating and can be expressed as floating electrodes. In addition, the dummy electrodes SD16 and SD25 cover the dummy holes 13, 23 and 23*a*, thereby preventing or reducing defects that can be caused by the dummy holes 13, 23 and 23*a* in a subsequent process after the heat treatment process. In addition, the dummy electrodes SD16 and SD25 can be omitted.

Figure 4A:
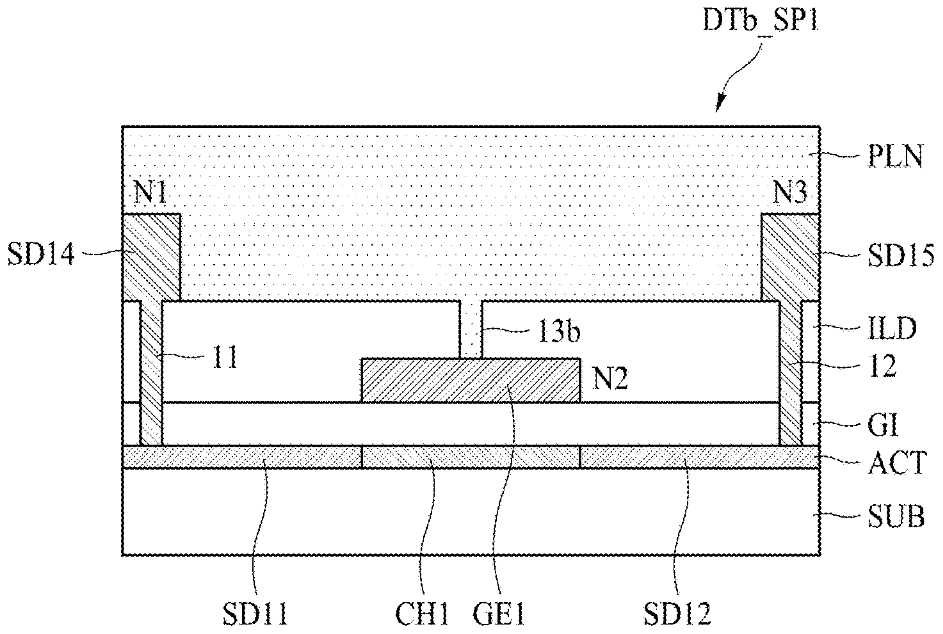
FIGS. 4A to 4C are overviews illustrating a driving transistor structure having a dummy hole according to yet another embodiment of the present disclosure.
Figure 4B:
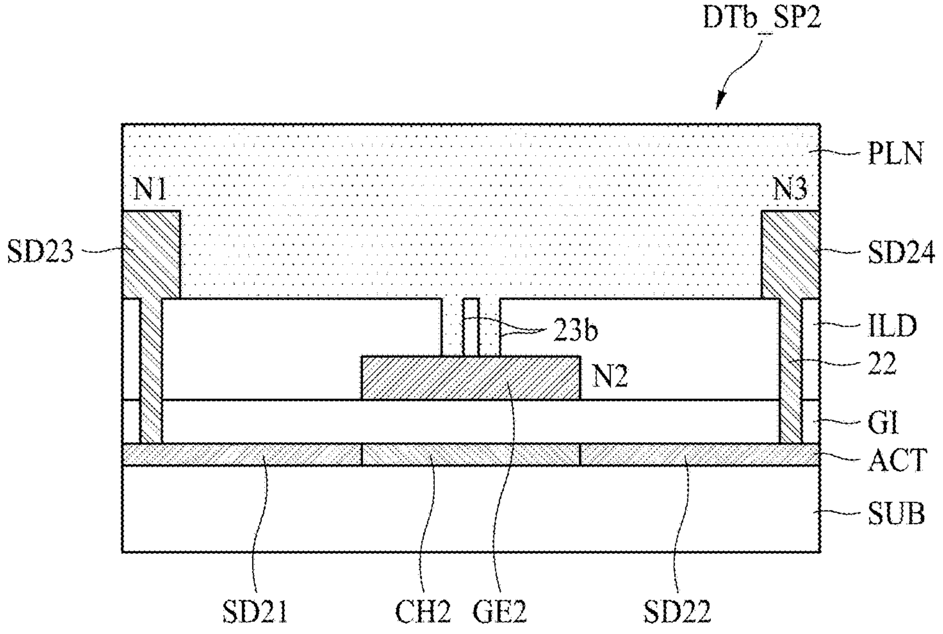
Figure 4C:
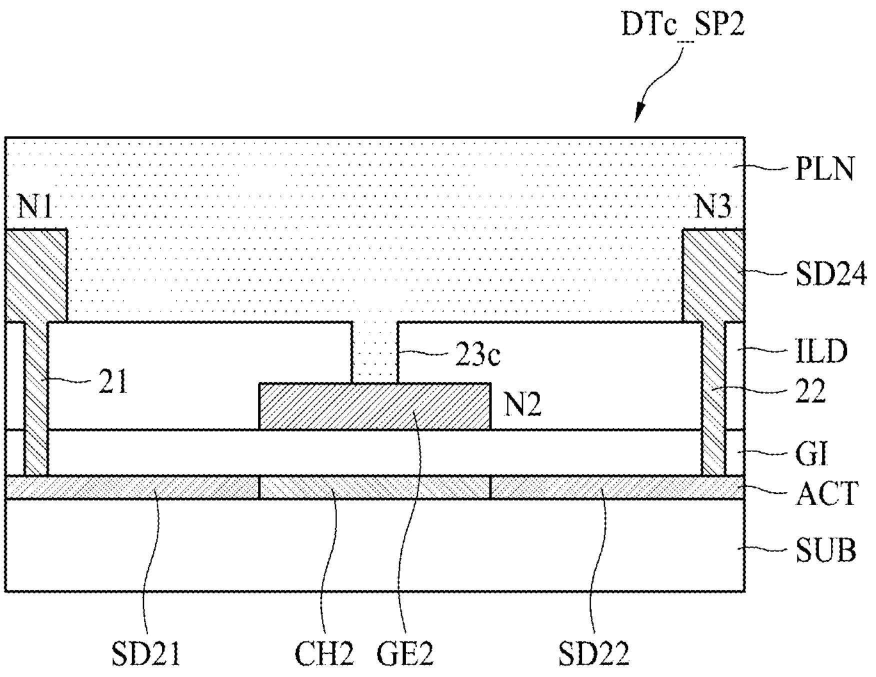

Referring to FIGS. 4A to 4C, a dummy hole 13*b* disposed in a first driving transistor DTb_SP1 of a first subpixel and dummy holes 23*b* and 23*c* disposed in a second driving transistor DTb_SP2 and DTc_SP2 of a second subpixel can have a structure in which they are buried by an insulating material of a planarization layer PLN disposed on source/drain connection electrodes SD14, SD15, SD23, and SD24.

Further, the second driving transistor DT_SP2, DTa_SP2, DTb_SP2, or DTc_SP2, having the dummy hole 23, 23*a*, 23*b*, or 23*c* with a larger aperture ratio, a larger area, or a larger number than the dummy holes 13 or 13*b* of the first driving transistor DT_SP1 or DTb_SP1, can have the greater threshold voltage variation amount ΔVth depending on temperature than the first driving transistor DT_SP1 or DTb_SP1. In case that a plurality of dummy holes are included as shown in FIG. 4B, the aperture ratio and the area may each refer to the total aperture ratio and the total aperture area of the plurality of dummy holes. In addition, the first driving transistor DT_SP1 or DTb_SP1 can be applied to the first sub-pixel, which has a relatively low luminance variation characteristic depending on the temperature of a light-emitting element. Meanwhile, the second driving transistor DT_SP2, DTa_SP2, DTb_SP2, or DTc_SP2 can be applied to the second sub-pixel, which has a relatively high luminance variation characteristic depending on the temperature of a light-emitting element.

Accordingly, the temperature luminance sensitivity TLS of the second subpixel can be further reduced by the second driving transistor DT_SP2, DTa_SP2, DTb_SP2, or DTc_SP2, and as a result, the difference in luminance variation according to temperature between the first and second subpixels is reduced or minimized, thereby reducing or minimizing the temperature color sensitivity TCS of the subpixels, and reducing or minimizing white color coordinate fluctuation according to temperature fluctuation.

In addition, the dummy holes 13, 13*b*, 23, 23*a*, 23*b*, and 23*c* of the driving transistors DT_SP1, DTb_SP1, DT_SP2, DTa_SP2, DTb_SP2, and DTc_SP2 can be arranged to overlap the driving transistors DT_SP1, DTb_SP1, DT_SP2, DTa_SP2, DTb_SP2, and DTc_SP2 or can be arranged in insulating layers of adjacent areas that do not overlap the driving transistors DT_SP1, DTb_SP1, DT_SP2, DTa_SP2, DTb_SP2, and DTc_SP2. Further, the dummy hole 13, 13*b*, 23, 23*a*, 23*b*, or 23*c* of driving transistors DT_SP1, DTb_SP1, DT_SP2, DTa_SP2, DTb_SP2, or DTc_SP2 can be arranged in insulating layers in areas adjacent to the gate electrodes GE1 or GE2.

In addition, the dummy hole 13, 13*b*, 23, 23*a*, 23*b*, or 23*c* of the driving transistors DT_SP1, DTb_SP1, DT_SP2, DTa_SP2, DTb_SP2, or DTc_SP2 can be arranged to either overlap or not overlap with at least one of the gate electrode GE1 or GE2 and the active layer ACT. Also, at least some of the dummy holes 13, 13*b*, 23, 23*a*, 23*b*, and 23*c* of the driving transistors DT_SP1, DTb_SP1, DT_SP2, DTa_SP2, DTb_SP2, and DTc_SP2 can be arranged not to overlap with the gate electrodes GE1 and GE2 or the active layer ACT.

Further, the closer the dummy holes 13, 13*b*, 23, 23*a*, 23*b*, and 23*c* in the driving transistors DT_SP2, DTa_SP2, DTb_SP2, and DTc_SP2 are to the active layer ACT or the channels CH1 and CH2, the more the emission of hydrogen atoms in the insulating layers close to the active layer ACT increases, thereby further increasing the threshold voltage variation amount ΔVth depending on the temperature. Accordingly, in the display device according to one embodiment, the temperature luminance sensitivity TLS and the temperature chromatic sensitivity TCS of the subpixels can be further reduced, thereby improving optical quality.

Figure 5:
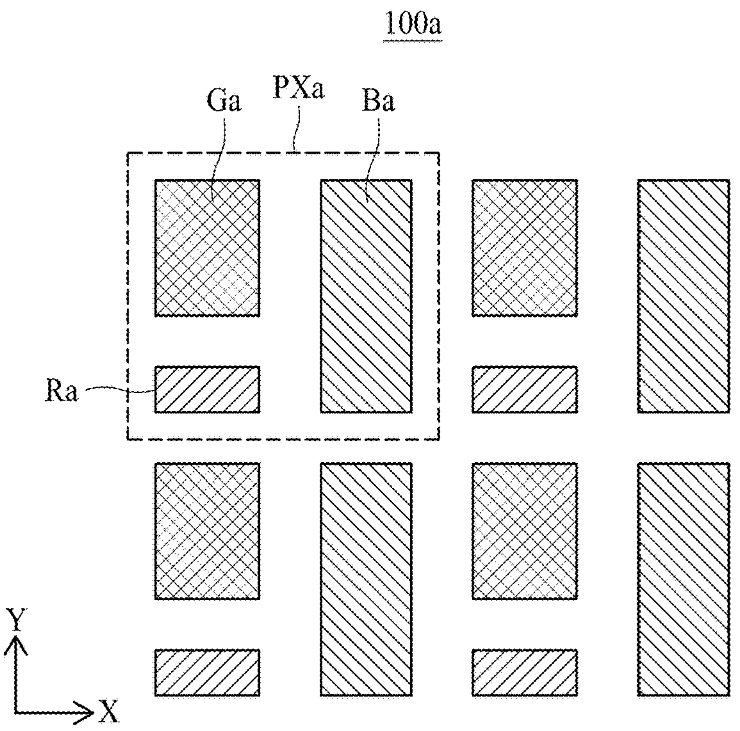
FIG. 5 is a diagram illustrating a portion of a pixel array of a display device according to one embodiment of the present disclosure.
Figure 6:
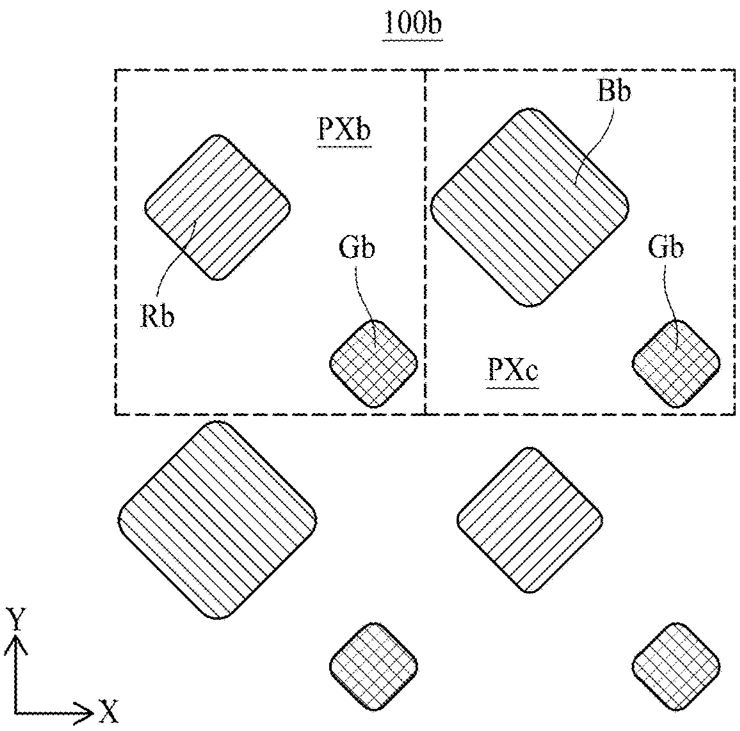
FIG. 6 is a diagram illustrating a portion of a pixel array of a display device according to another embodiment of the present disclosure.

Next, FIGS. 5 and 6 are drawings illustrating a portion of a pixel array of a display device according to one embodiment of the present disclosure. Referring to FIG. 5, a display panel 100*a* includes a pixel matrix in which pixels PXa including R/G/B subpixels Ra, Ga, Ba are repeatedly arranged in a first direction X and a second direction Y. The G subpixel Ga and the R subpixel Ra can be arranged adjacent to each other in the second direction Y, and the B subpixel Ba can be arranged adjacent to the G subpixel Ga and the R subpixel Ra in the first direction X, but is not limited to this arrangement structure.

Referring to FIG. 6, a display panel 100*b* according to one embodiment can include a pixel matrix in which first type pixels PXb including R/G subpixels Rb, Gb and second type pixels PXc including B/G subpixels Bb, Gb are alternately and repeatedly arranged in the first direction X and the second direction Y. The R subpixels Rb and the B subpixels Bb can be arranged adjacent to each other in the first direction X and the second direction Y, the G subpixels Gb can be arranged adjacent to the R subpixels Rb in a first diagonal direction, and the G subpixels Gb can be arranged adjacent to the B subpixels Bb in a second diagonal direction, but is not limited to this arrangement structure.

Further, the R/G/B subpixels Ra/Ga/Ba or Rb/Gb/Bb/Gb can have the form of an emitting area where the R/G/B light-emitting elements emit light, and the remaining area excluding the emitting area can be a non-emitting area where a black matrix is arranged. Among the R/G/B subpixels Ra/Ga/Ba or Rb/Gb/Bb/Gb, the light emitting area (aperture ratio) of the B light emitting element in the B subpixel Ba, Bb can be the largest, considering the efficiency and lifespan of the B light emitting element. The light emitting area aperture ratio of either the R light emitting element of the R subpixel Ra, Rb or the G light emitting element of the G subpixel Ga, Gb can be the smallest. In addition, as shown in FIG. 5, the light emitting area of the G light emitting element of the G subpixel Ga can be larger than the light emitting area of the R light emitting element of the R subpixel Ra, or as shown in FIG. 6, the light emitting area of the R light emitting element of the R subpixel Rb can be larger than the light emitting area of the G light emitting element of the G subpixel Gb.

Referring to FIGS. 2A to 6, each of the R/G/B subpixels Ra/Ga/Ba, Rb/Gb/Bb/Gb according to one embodiment can include either any one of first driving transistors DT_SP1 and DTb_SP1 having the dummy hole 13 or 13*b*, or any one of the second driving transistors DT_SP2, DTa_SP2, DTb_SP2, and DTc_SP2 having a dummy hole 23, 23*a*, 23*b*, or 23*c*. Accordingly, the display panel 100*a* or 100*b* according to one embodiment can reduce the temperature luminance sensitivity TLS and temperature color sensitivity TCS of the R/G/B subpixels Ra/Ga/Ba or Rb/Gb/Bb/Gb by increasing the threshold voltage variation amount ΔVth depending on the temperature of the driving transistor DT_SP1, DTb_SP1, DT_SP2, DTa_SP2, DTb_SP2, or DTc_SP2.

In an R/G/B subpixel Ra/Ga/Ba or Rb/Gb/Bb/Gb according to one embodiment, at least one of the R/G subpixels Ra/Ga or Rb/Gb can include the first driving transistor DT_SP1 or DTb_SP1 having a dummy hole 13 or 13*b*. The B subpixel Ba or Bb, which has a relatively higher aperture ratio of the B light-emitting element or a greater luminance variation depending on the temperature, can include the second driving transistor DT_SP2, DTa_SP2, DTb_SP2, or DTc_SP2 having a dummy hole 23, 23*a*, 23*b*, or 23*c*.

Accordingly, the display panel 100*a* or 100*b* can have different threshold voltage variation amounts ΔVth depending on the temperature of the first driving transistor DT_SP1, or DTb_SP1 and the second driving transistor DT_SP2, DTa_SP2, DTb_SP2, or DTc_SP2, thereby reducing or minimizing the difference in luminance variation depending on the temperature between the R/G/B subpixels Ra/Ga/Ba or Rb/Gb/Bb/Gb, reducing or minimizing the temperature color sensitivity TCS of the R/G/B subpixels Ra/Ga/Ba or Rb/Gb/Bb/Gb, and reducing or minimizing the variation of white color coordinates depending on the temperature variation. For example, the B subpixels can be configured to with a number, shape or size of dummy holes to produce a larger threshold voltage variation amounts ΔVth than the R or G subpixels, for example, so the difference in luminance variation depending on the temperature between the R/G/B subpixels can be reduced. Forming the dummy holes to have different depths can also be used to adjust the threshold voltage variation amount (dummy holes formed closer to the ACT layer increases the threshold voltage variation amount.

Figure 7:
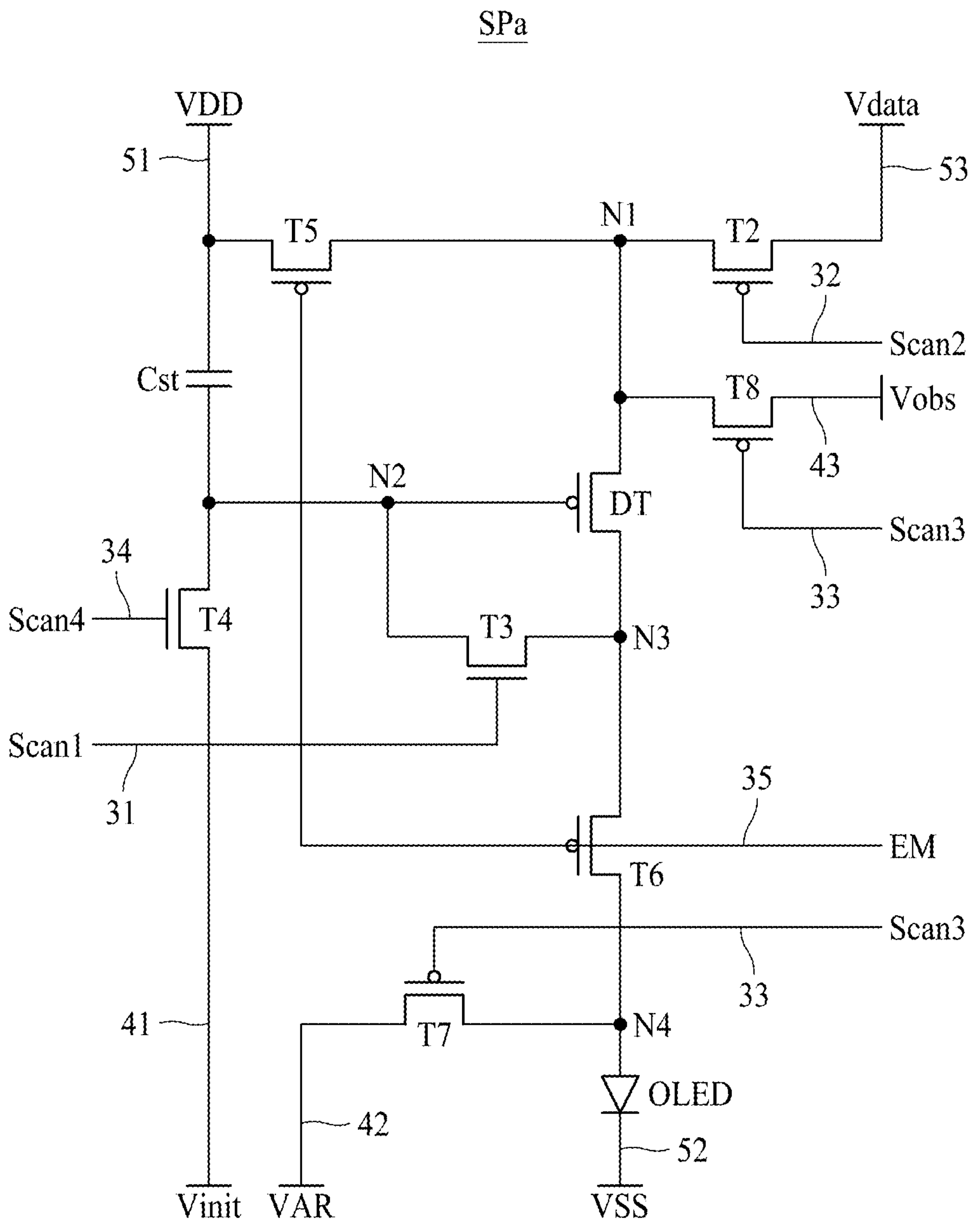
FIG. 7 is an equivalent circuit diagram illustrating a subpixel configuration according to one embodiment of the present disclosure.

Next, FIG. 7 is an equivalent circuit diagram illustrating a subpixel according to one embodiment of the present disclosure. Referring to FIG. 7, a subpixel SPa includes a light-emitting element OLED and the pixel circuit that independently drives the light-emitting element OLED, and the pixel circuit can include the driving transistor DT, a plurality of transistors T2 to T8, and a storage capacitor Cst, but the present disclosure is not limited thereto. The subpixel may include other number of transistors and/or capacitors and/or other circuit configuration than shown in FIG. 7.

Each of the transistors DT, T2 to T8 of the pixel circuit can utilize any one of a polysilicon semiconductor such as low-temperature polysilicon semiconductor (LTPS), an amorphous silicon semiconductor, and an oxide semiconductor such as IZO (InZnO)-based, IGO (InGaO)-based, ITO (InSnO)-based, IGZO (InGaZnO)-based, IGZTO (InGaZnSnO)-based, GZTO (GaZnSnO)-based, GZO (GaZnO)-based, and ITZO (InSnZnO)-based semiconductor. In addition, some or all of the transistors DT, T2 to T8 of the pixel circuit can be formed as P-type transistors, such as P-type polysilicon transistors or P-type oxide transistors. Also, some or all of the transistors DT, T2 to T8 of the pixel circuit can be formed as N-type transistors, such as N-type oxide transistors or N-type polysilicon transistors. In one embodiment, the transistors DT, T2 to T8 of the pixel circuit can be formed by mixing P-type transistors and N-type transistors. For example, the transistors DT, T2 to T8 of the pixel circuit may be formed by mixing P-type polysilicon transistors and N-type oxide transistors.

In one embodiment, the driving transistor DT and some of the transistors T2, T5-T8 can be formed of P-type low-temperature polycrystalline silicon LTPS transistors having high mobility, and at least one of the transistors T3, T4 can be formed of an N-type oxide transistor having a smaller off-state current leakage current than the LTPS transistor. A sampling transistor (third transistor) T3 can be controlled by a first gate line 31 and can connect the second node N2 to which the gate electrode of the driving transistor DT is connected, and a third node N3 to which a second source/drain electrode of the driving transistor DT is connected. Also, the sampling transistor T3 can be turned on by a gate-on voltage of a first scan signal Scan1 supplied through the first gate line 31, and can connect the gate electrode of the driving transistor DT and the second source/drain electrode during a sampling period, thereby connecting the driving transistor DT in a diode structure.

In addition, a switching transistor (second transistor) T2 can be controlled by a second gate line 32 and can connect the first node N1 connected to a data line 53 and a first source/drain electrode of the driving transistor DT. Further, the switching transistor T2 can be turned on by a gate-on voltage of a second scan signal Scan2 supplied through the second gate line 32, and can supply a data voltage V data supplied through the data line 53 to the driving transistor DT during a data programming period.

As shown in FIG. 7, an operation control transistor (fifth transistor) T5 can be controlled by a fifth gate line 35 and can connect a first power line 51 supplying a first power voltage VDD and the first node N1 of the driving transistor DT. Further, the operation control transistor T5 can be turned on by a gate-on voltage of the light emission control signal EM supplied through the fifth gate line 35, and can supply the first power voltage VDD supplied through the first power line 51 to the first node N1 of the driving transistor DT during the light emission period.

Also, a light-emitting control transistor (sixth transistor) T6 can be controlled by the fifth gate line 35 and can connect the third node N3 of the driving transistor DT and the fourth node N4 connected to an anode electrode of the light-emitting element OLED. The light-emitting control transistor T6 can be turned on by the gate-on voltage of the light-emitting control signal EM supplied through the fifth gate line 35, and can connect the third node N3 of the driving transistor DT and the anode electrode of the light-emitting element OLED during the light-emitting period.

As shown in FIG. 7, a first initialization transistor (fourth transistor) T4 can be controlled by a fourth gate line 34 and can connect the second node N2 of the driving transistor DT and a first initialization voltage line 41. Further, the first initialization transistor T4 can be turned on by a gate-on voltage of the fourth scan signal Scan4 supplied through the fourth gate line 34, and can supply the first initialization voltage Vinit supplied through the first initialization voltage line 41 to the second node N2 of the driving transistor DT during the initialization period.

Also, a second initialization transistor (seventh transistor) T7 can be controlled by the third gate line 33 and can connect the second initialization voltage line 42 and the fourth node N4 connected to the anode of the light-emitting element OLED. The second initialization transistor T7 can be turned on by the gate-on voltage of a third scan signal Scan3 supplied through the third gate line 33, and can supply the second initialization voltage VAR supplied through the second initialization voltage line 42 to the fourth node N4 connected to the anode electrode of the light-emitting element OLED during the initialization period. The second initialization voltage VAR can be expressed as an anode reset voltage.

A third initialization transistor (the eighth transistor) T8 can be controlled by a third gate line 33 and can connect a third initialization voltage line 43 and the first node N1 of the driving transistor DT. The third initialization transistor T8 can be turned on by the gate-on voltage of the third scan signal Scan3 supplied through the third gate line 33, and can supply the third initialization voltage Vobs supplied through the third initialization voltage line 43 to the first node N1 to which a first source/drain electrode of the driving transistor DT is connected during an initialization period. The third initialization voltage Vobs can be expressed as an on bias stress voltage that suppresses a threshold voltage shift of the driving transistor DT.

In addition, the storage capacitor Cst can be connected between the first power line 51 and the second node N2 of the driving transistor DT. Also, the storage capacitor Cst can charge a differential voltage between the first power voltage VDD supplied through the first power line 51 and the data voltage V data supplied from the data line 53 to the second node N2 via the switching transistor T2, the driving transistor DT, and the sampling transistor T3. During a sampling period in which the driving transistor DT is connected in a diode structure through the sampling transistor T3, the storage capacitor Cst can sample and store the threshold voltage Vth of the driving transistor DT, and can provide a data voltage with a compensated threshold voltage to the second node N2 of the driving transistor DT. Further, the storage capacitor Cst can charge and hold the differential voltage between the first power supply voltage VDD and the data voltage V data for which the threshold voltage Vth of the driving transistor DT is compensated as a target voltage, and can provide the held target voltage as a driving voltage of the driving transistor DT.

In addition, the driving transistor (first transistor) DT can have the gate electrode connected to the second node N2, the first source/drain electrode connected to a first node N1, and the second source/drain electrode connected to the third node N3. The driving transistor DT can also control the amount of current flowing to the light-emitting element OLED through the light-emitting control transistor T6 according to the target voltage charged in the storage capacitor Cst, thereby controlling the light-emitting intensity of the light-emitting element EL.

According to one embodiment, the driving transistor DT can be applied with any one of the driving transistors DT_SP1, DTb_SP1, DT_SP2, DTa_SP2, DTb_SP2, and DTc_SP2 having dummy holes described above, so that the threshold voltage variation amount ΔVth depending on temperature can be large. The light-emitting element OLED can include an anode connected to the third node of the driving transistor DT through the light-emission control transistor T6, a cathode connected to a second power line 52 supplying a second power voltage VSS, and an organic light-emitting layer between the anode and the cathode. In addition, the light-emitting element EL can emit light with luminance proportional to the amount of driving current supplied from the driving transistor DT through the light-emission control transistor T6.

Referring to FIGS. 1 and 7, the first to fourth gate lines 31, 32, 33, and 34 can be driven by a scan driver included in the gate driver 200, and the fifth gate line 35 can be driven by a light emission control driver included in the gate driver 200. Also, the data voltage V data can be supplied from the data driver 300, and the first power voltage VDD, the second power voltage VSS, the first initialization voltage Vinit, the second initialization voltage VAR, and the third initialization voltage V obs can be supplied from the power management circuit 700.

Next, FIGS. 8A to 8D are drawings illustrating the layout structure of subpixels according to comparative examples and one embodiment of the present disclosure. In particular, the subpixels illustrated in FIGS. 8A to 8D illustrate the layout of a first active layer, a first gate metal layer, the upper metal layer, a second active layer, a second gate metal layer, and a first source/drain metal layer arranged on a circuit element layer in a display panel, and the layout of the second source/drain metal layer of the circuit element layer and a light-emitting element layer arranged on the circuit element layer are omitted.

Referring to FIGS. 8A to 8D, the pixel circuit of the subpixel according to the comparative example and one embodiment can include the driving transistor DT and the plurality of transistors T2 to T8 and the storage capacitor Cst as illustrated in FIG. 7. The first initialization voltage line 41 configured to supply the first initialization voltage Vini, the fourth gate line 34 configured to supply a fourth scan signal Scan4, the second gate line 32 configured to supply the second scan signal Scan2, the first gate line 31 configured to supply the first scan signal Scan1, the first power line 51 configured to supply the first power voltage VDD, the fifth gate line 35 configured to supply the emission control signal EM, a third scan line 33 configured to supply the third scan signal Scan3, the third initialization voltage line 43 configured to supply the third initialization voltage Vobs, and second-first and second-second initialization voltage lines 42*r*, 42*gb* configured to supply second-first and second-second initialization voltages VARr, VARgb, respectively, can be arranged to extend in a first direction X and be spaced apart from each other in the second direction Y. As shown, a redundancy line WDR extending in the first direction X can be additionally arranged between the fifth gate line 35 and the third scan line 33 for dark spot repair.

In addition, the driving transistor DT, the switching transistor T2, the operation control transistor T5, an emission control transistor T6, the second initialization transistor T7, and the third initialization transistor T8 can include the first active layer ACT formed of LTPS and integrally connected. Further, the sampling transistor T3 and the first initialization transistor T4 can include the second active layer OACT made of an oxide semiconductor and integrally connected. Also, the driving transistor DT and the plurality of transistors T2 to T8 of the pixel circuit can include an active layer composed of LTPS or can include an active layer composed of an oxide semiconductor.

In addition, the gate electrode GE1 of the driving transistor DT, a first capacitor electrode C1 of the storage capacitor Cst, a gate electrode GE5 of the operation control transistor T5, a gate electrode GE6 of the emission control transistor T6, and the third scan line 33 including gate electrodes GE7 and GE8 of second and third initialization transistors T7 and T8 can be provided as the first gate metal layer on the first active layer ACT.

Also, a second capacitor electrode C2 of the storage capacitor Cst, the sampling transistor T3 and light-shielding electrode 112 and 114 of the first initialization transistor T4 can be provided as an upper metal layer on the first gate metal layer. A lower line 103 of the first gate line 31 including a gate electrode GE3 of the sampling transistor T3 and a gate electrode GE4 of the first initialization transistor T4 can be provided as the second gate metal layer on the second active layer OACT.

In addition, the first initialization voltage line 41, the fourth gate line 34, the second gate line 32, an upper line 104 of the first gate line 31, the first power line 51, the fifth gate line 35, the third scan line 33 supplying the third scan signal Scan3, the third initialization voltage line 43, the second-1 and second-2 initialization voltage lines 42*r* and 42*gb*, and connection electrodes 102, 105, 106, and 107 can be provided as the first source/drain metal layer on the second gate metal layer.

Further, the driving transistor DT and the storage capacitor Cst can be placed between the fourth gate line 34 and the fifth gate line 35. Also, the driving transistor DT and the storage capacitor Cst can overlap in a third direction Z, and the first power line 51 can overlap the driving transistor DT and the storage capacitor Cst in the third direction Z.

In addition, the driving transistor DT, first transistor can include a first channel CH1, the first-first source/drain electrode SD 11 and a first-second source/drain electrode SD 12 disposed on the first active layer ACT, and the first gate electrode GE1 overlapping the first channel CH1 in the third direction Z. The first gate electrode GE1 can be connected to the connection electrode 105 through the second node N2 and a contact hole 64. The connection electrode 105 can be connected to a sampling transistor T3, third transistor and the first initialization transistor T4, fourth transistor through a contact hole 65. The first-first source/drain electrode SD11 can be connected to a fifth-first source/drain electrode SD51 of the operation control transistor T5, fifth transistor and a second-second source/drain electrode SD22 of the switching transistor T2, second transistor through the first node N1. The first-second source/drain electrode SD 12 can be connected to the sampling transistor T3 and the light emission control transistor T6, sixth transistor through the third node N3.

In addition, the storage capacitor Cst can include the first capacitor electrode C1 integrally arranged with the first gate electrode GE1 of the driving transistor DT, and the second capacitor electrode C2 overlapping the first capacitor electrode C1 in the third direction Z. The second capacitor electrode C2 can be connected to the first power line 51 through a contact hole 70.

Further, the switching transistor T2, second transistor can include a second channel CH2, a second-first source/drain electrode SD21 and the second-second source/drain electrode SD22 disposed on the first active layer ACT, and a second gate electrode GE2 overlapping a second channel CH2 in the third direction Z. The second gate electrode GE2 can be connected to the second gate line 32 overlapping in the third direction Z through a contact hole 62. The second-first source/drain electrode SD21 can be connected to the data line 53 shown in FIG. 7 provided in the second source/drain metal layer through the contact hole 61 and the connection electrode 102. The second-second source/drain electrode SD22 can be connected to the first-first source/drain electrode SD11 of the driving transistor DT through a first node N1.

Also, the operation control transistor T5, fifth transistor can include a fifth channel CH5, the fifth-first source/drain electrode SD 51 and a fifth-second source/drain electrode SD52 disposed in the first active layer ACT, and the fifth gate electrode GE5 overlapping the fifth channel CH5 in the third direction Z. The fifth gate electrode GE5 can be connected to the fifth gate line 32 through a contact hole 72, and the fifth-first source/drain electrode SD51 can be connected to the first-first source/drain electrode SD11 of the driving transistor DT through the first node N1. The second-second source/drain electrode SD22 can be connected to the first power line 51 through the contact hole 71.

Further, the light-emitting control transistor T6, sixth transistor can include a sixth channel CH6, a sixth-first source/drain electrode SD61 and a sixth-second source/drain electrode SD62 disposed in the first active layer ACT, and the sixth gate electrode GE6 overlapping the sixth channel CH6 in the third direction Z. The sixth gate electrode GE6 can be connected to the fifth gate line 35 through the contact hole 72, and the sixth-first source/drain electrode SD61 can be connected to the first-second source/drain electrode SD12 of the driving transistor DT through a third node N3. In addition, the sixth-second source/drain electrode SD62 can be connected to the anode electrode of a light-emitting element OLED shown in FIG. 7 through a contact hole 73 and the connection electrode 107.

Further, the third initialization transistor T8, the eighth transistor can include an eighth channel CH8, an eighth-first source/drain electrode SD81 and an eighth-second source/drain electrode SD82 disposed in the first active layer ACT, and an eighth gate electrode GE8 overlapping the eighth channel CH8 in the third direction Z. Also, the eighth gate electrode GE8 can be integrally connected to the third gate line 32, and the eighth-first source/drain electrode SD81 can be connected to the fifth-second source/drain electrode SD52 of the operation control transistor T5. Also, the eighth-second source/drain electrode SD82 can be connected to the third initialization voltage line 43 through a contact hole 74.

Further, the second initialization transistor T7, seventh transistor can include a seventh channel CH7, a seventh-first source/drain electrode SD71 and a seventh-second source/drain electrode SD72 disposed in the first active layer ACT, and the seventh gate electrode GE7 overlapping the seventh channel CH7 in the third direction Z. The seventh gate electrode GE7 can be integrally connected to the third gate line 32, and the seventh-first source/drain electrode SD71 can be connected to the sixth-second source/drain electrode SD62 of the light-emitting control transistor T6. Also, the seventh-second source/drain electrode SD72 can be connected to the second-second initialization voltage line 42*gb* through a contact hole 75.

As shown, the sampling transistor T3 can include a third channel CH3, a third-first source/drain electrode SD31, and a third-second source/drain electrode SD32 disposed on the second active layer OACT, and the third gate electrode GE3 overlapping the third channel CH3 in the third direction Z. Also, the third gate electrode GE3 can be formed integrally with the lower line 103 of the first gate line 31 and can be connected to the upper line 104 of the first gate line 31 through a contact hole 63. The third-first source/drain electrode SD 31 can be connected to the third node N3 of the driving transistor DT through the contact holes 68, 69 and the connection electrode 106. Further, the third-second source/drain electrode SD 32 can be connected to the second node N2 of the driving transistor DT through the contact hole 64, 65 and the connection electrode 105. Also, the first light-shielding electrode 112 overlapping the sampling transistor T3 in the third direction Z can be connected to the upper line 104 of the first gate line 31 through the contact hole 163.

In addition, the first initialization transistor T4, fourth transistor can include a fourth channel CH4, a fourth-first source/drain electrode SD41 and a fourth-second source/drain electrode SD42 disposed on the second active layer OACT, and the fourth gate electrode GE4 overlapping the fourth channel CH4 in the third direction Z. Also, the fourth gate electrode GE4 can be connected to the fourth gate line 34 through a contact hole 66. The fourth-first source/drain electrode SD41 can be connected to the second node N2 of the driving transistor DT through the contact holes 64, 65 and the connection electrode 105. The fourth-second source/drain electrode SD42 can be connected to the first initialization voltage line 41 through a contact hole 67. In addition, the third light-shielding electrode 114 overlapping the first initialization transistor T4 in the third direction Z can be connected to the fourth gate line 34 through a contact hole 166.

Figure 8A:
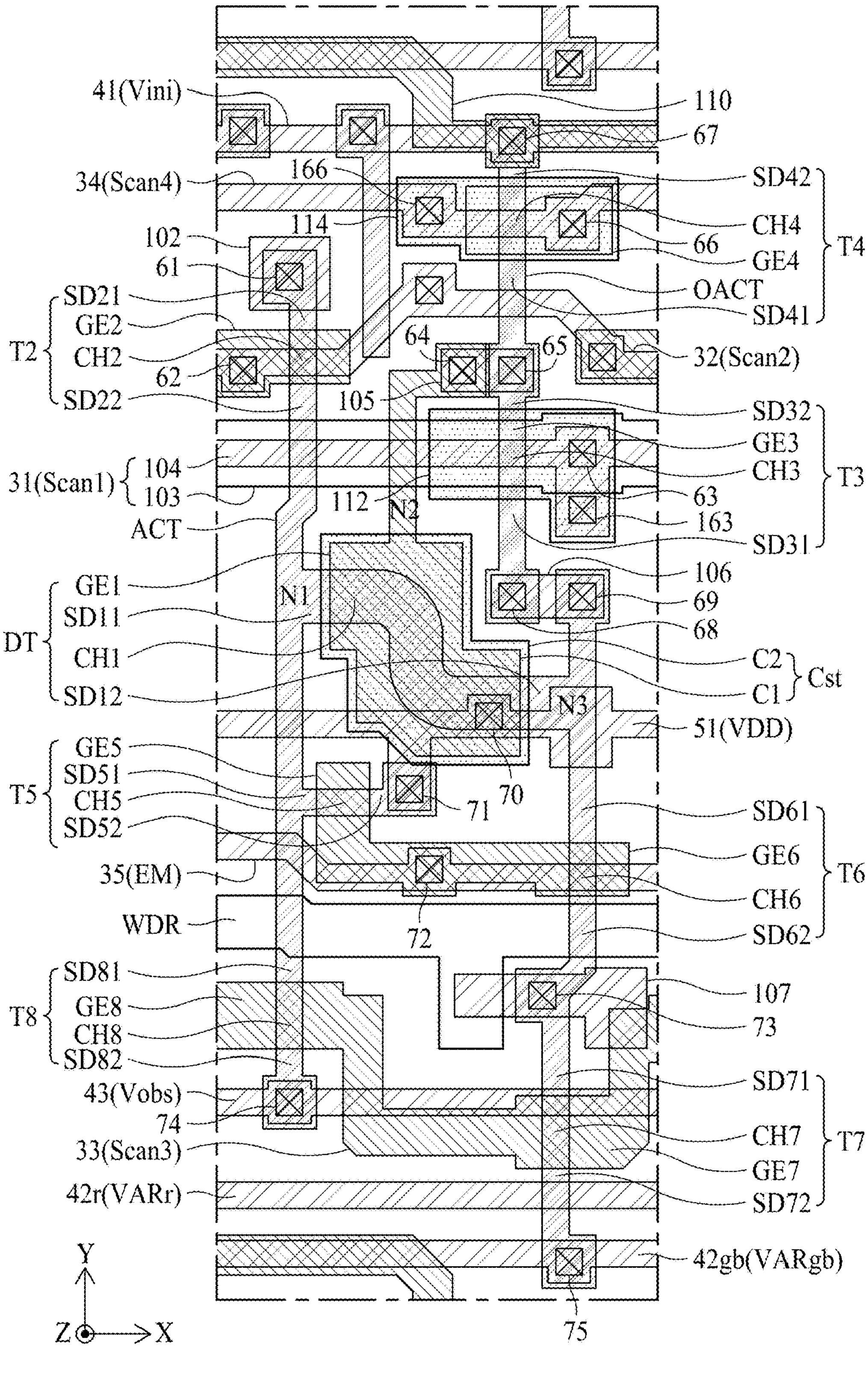
FIGS. 8A to 8D are overviews illustrating a layout structure of subpixels according to comparative examples and one embodiment of the present disclosure.
Figure 8B:
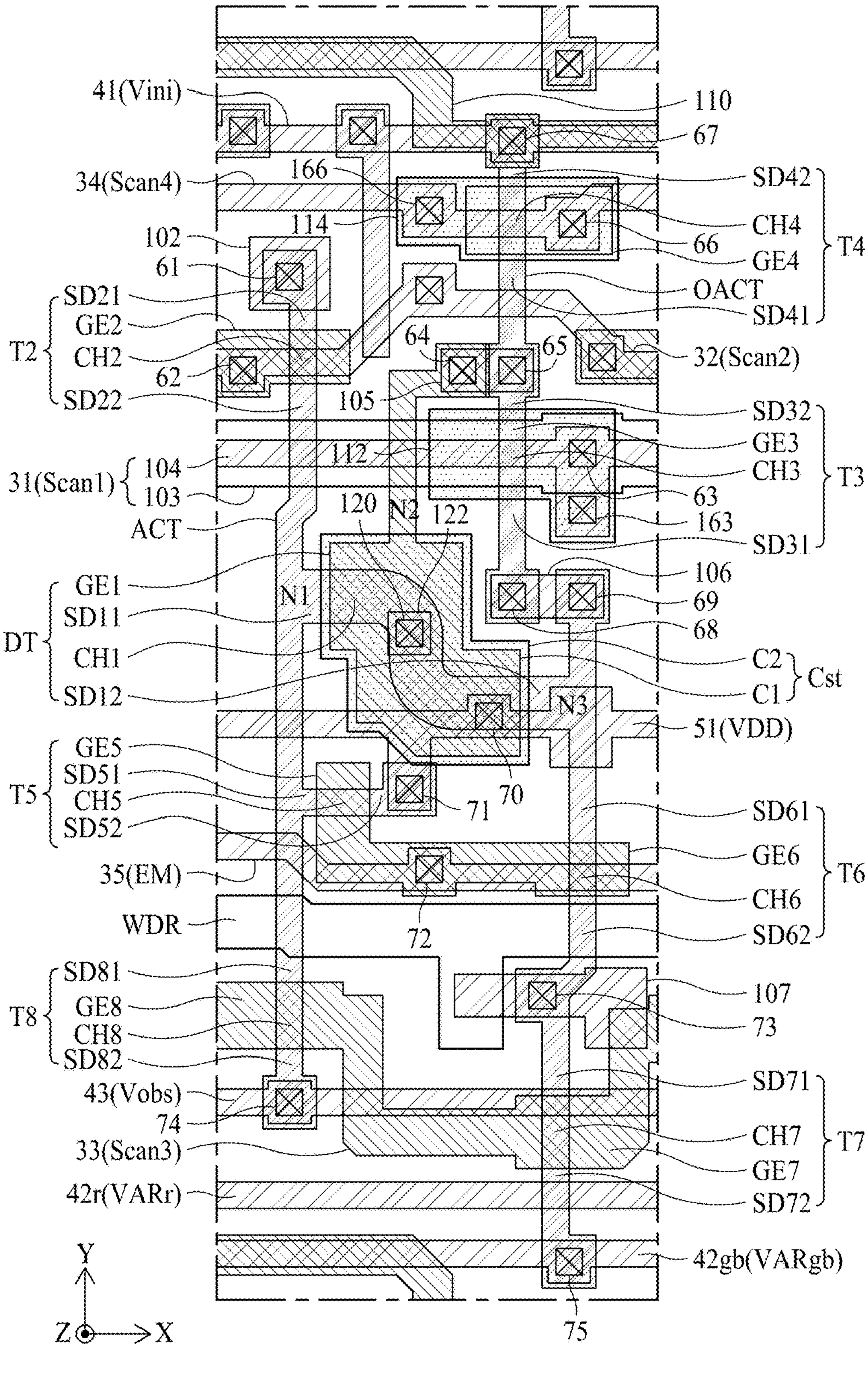
Figure 8C:
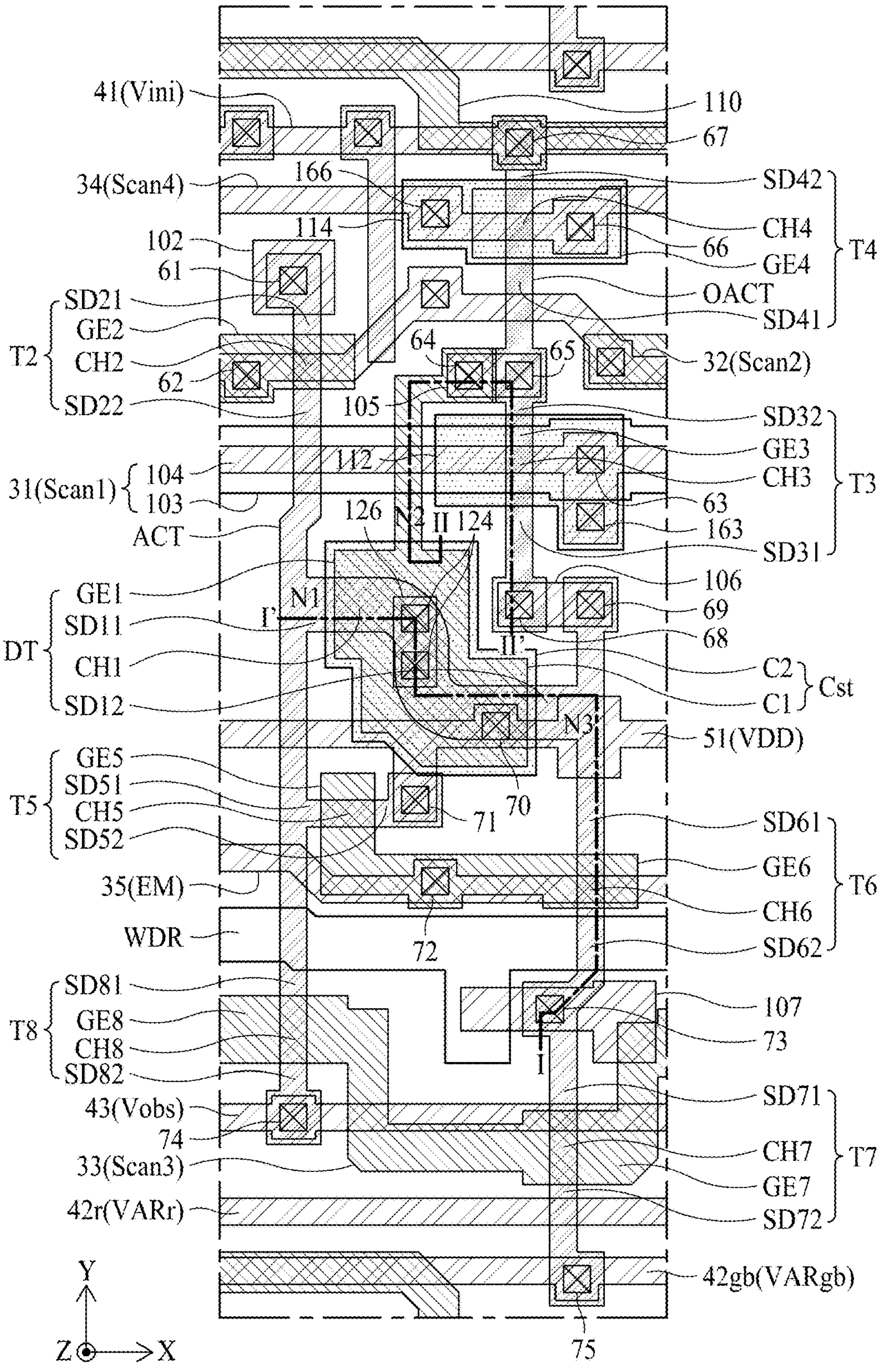

Referring to FIG. 8A, the driving transistor DT of the subpixel according to the comparative example can have a structure without a dummy hole. Referring to FIG. 8B, the driving transistor DT of the subpixel according to one embodiment can include one dummy hole 120 and a dummy electrode 122 overlapping the gate electrode GE1 in the third direction Z. Referring to FIG. 8C, the driving transistor DT of a subpixel according to one embodiment can include two dummy holes 124 and a dummy electrode 126 overlapping the gate electrode GE1 in the third direction Z.

Figure 8D:
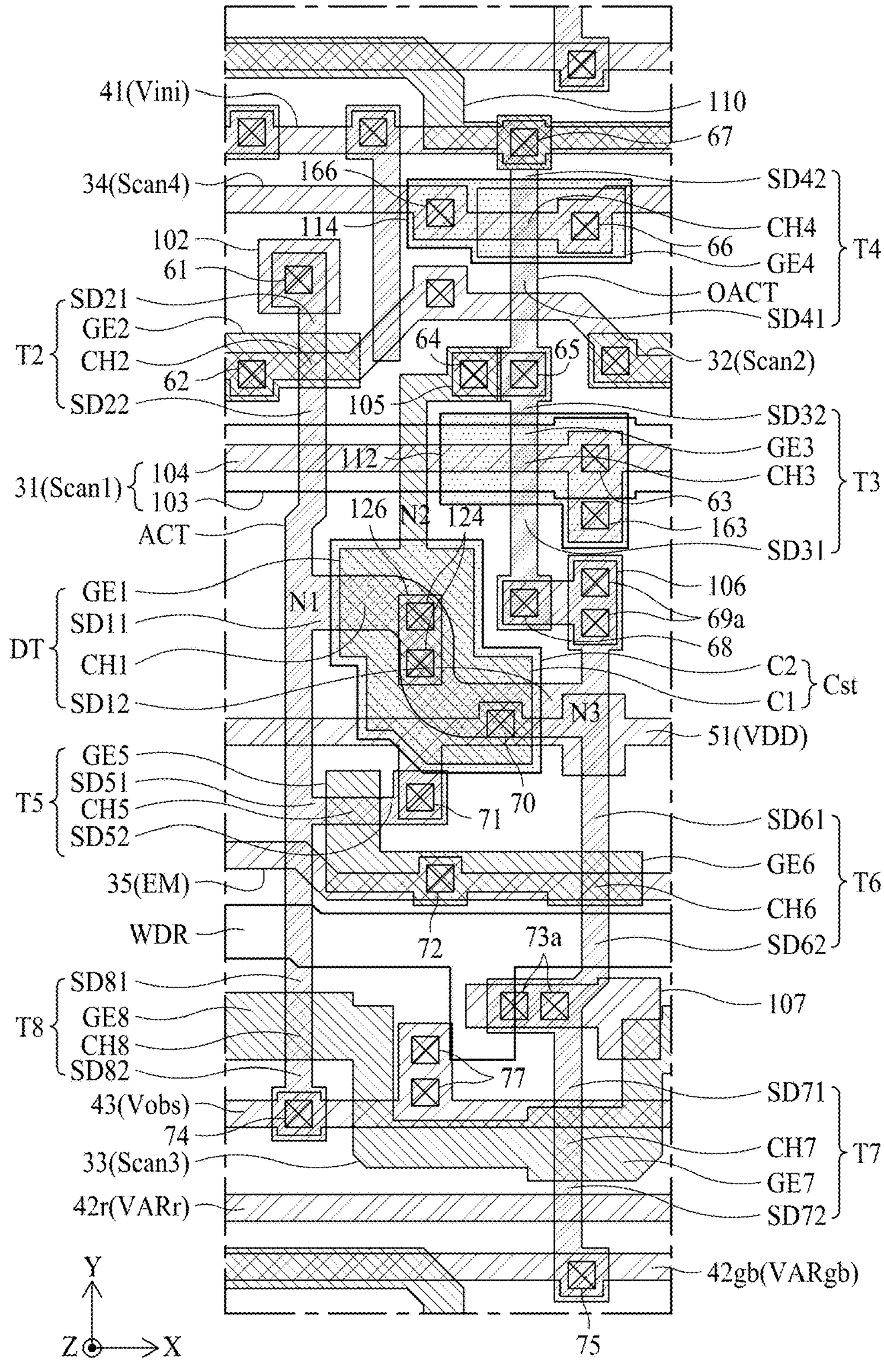

Referring to FIG. 8D, the driving transistor DT of the subpixel according to one embodiment can include two dummy holes 124 and the dummy electrode 126 overlapping the gate electrode GE1 in the third direction Z, and can include a plurality of contact holes (dummy holes) 69*a*, 73*a*, and 77 additionally arranged in an area adjacent to the driving transistor DT. For example, a number of contact holes 69*a* of the connection electrode 106 to which the sampling transistor T3 and the third node N3 of the driving transistor DT are connected can be increased to two, and a number of contact holes 73*a* of the connection electrode 107 to which the light-emitting control transistor T6 is connected can be increased to two. Two dummy holes 77 can be further arranged in a protruding area protruding in the second direction Y from the third initialization voltage line 43.

In addition, the subthreshold swing factor S-factor value of the driving transistor DT, the threshold voltage Vth, and the threshold voltage variation amount ΔVth depending on temperature in the subpixels according to the comparative example illustrated in FIG. 8A and the respective embodiments illustrated in FIGS. 8B to 8D are as shown in Table 1 below.

TABLE 1

| | Comparative example (FIG. 8A) | First embodiment (FIG. 8B) | Second embodiment (FIG. 8C) | Third embodiment (FIG. 8D) |
|---|---|---|---|---|
| S-factor [V/dec] | 0.42 V/dec | 0.52 V/dec | 0.54 V/dec | 0.58 V/dec |
| Vth [V] | −2.31 V | −2.88 V | −2.96 V | −2.98 V |
| ΔVth [mV/° C.] | 7.7 mV/° C. | 10.6 mV/° C. | 11.5 mV/° C. | 11.8 mV/° C. |

Referring to Table 1 above, compared to the driving transistor DT without the dummy hole illustrated in FIG. 8A, it can be seen that as the number of dummy holes 120, 124, 69*a*, 73*a*, and 77 increases, the S-factor value and the threshold voltage variation amount ΔVth depending on the temperature increase, and the threshold voltage Vth decreases.

Figure 9:
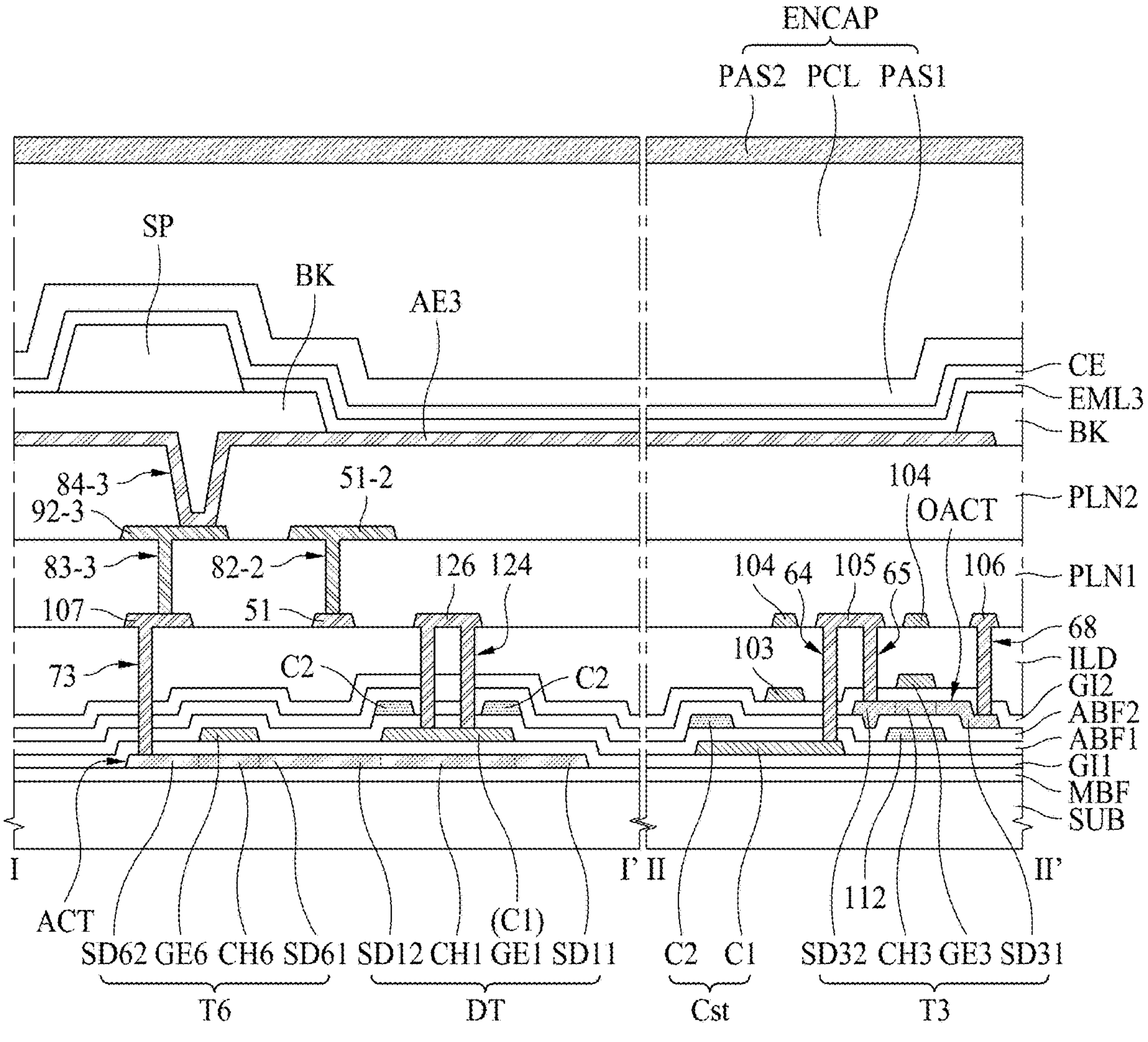
FIG. 9 is a cross-sectional view illustrating a subpixel according to one embodiment of the present disclosure.

Next, FIG. 9 is a cross-sectional view illustrating the structure of the subpixel according to one embodiment of the present disclosure. Specifically, FIG. 9 illustrates a cross-sectional structure of a subpixel along the I-I' cutting line and the II-II' cutting line shown in FIG. 8C.

Referring to FIGS. 8C and 9, the subpixel according to one embodiment can include the circuit element layer including the pixel circuit disposed on the substrate SUB, the light-emitting element layer including the light-emitting element disposed on the circuit element layer, and an encapsulation layer ENCAP disposed on the light-emitting element layer. The circuit element layer can include the driving transistor DT, the switching transistor T2, the sampling transistor T3, the first initialization transistor T4, the operation control transistor T5, the light-emitting control transistor T6, the second initialization transistor T7, the third initialization transistor T8, and the storage capacitor Cst.

In addition, the touch sensor array including a plurality of touch electrodes can be further arranged on the encapsulation layer ENCAP. A color filter array including a color filter and a black matrix can be further arranged on the touch sensor array, or a lens array can be further arranged.

FIG. 9 shows a representative cross-sectional structure of the light-emitting control transistor T6, the driving transistor DT, the storage capacitor Cst, and the sampling transistor T3. In addition, the light emitting control transistor T6 and the driving transistor DT can include the first active layer ACT made of LTPS.

Further, the sampling transistor T3 can include the second active layer OACT made of an oxide semiconductor. For example, the second active layer OACT can be made of the oxide semiconductor including, but no limited to, at least one of IZO (InZnO)-based, IGO (InGaO)-based, ITO (InSnO)-based, ZTO (ZnSnO)-based, IGZO (InGaZnO)-based, IGZTO (InGaZnSnO)-based, GZTO (GaZnSnO)-based, GZO (GaZnO)-based, and ITZO (InSnZnO)-based. In addition, the sampling transistor T3 can include the active layer made of LTPS.

In addition, the substrate SUB can include a plastic substrate or a glass substrate. The plastic substrate can be formed of a flexible material. For example, the substrate SUB can include at least one organic insulating material among an acrylic resin, an epoxy resin, a siloxane resin, a polyimide resin, and a polyamide resin, polymethylmetacrylicate (PMMA), polycarbonate (PC), polyvinylalcohol (PVA), acryliconitirle-butadiene-styrene (ABS), polyethylene terephthalate (PET), silicone, or polyurethane (PU). but the present disclosure is not limited thereto.

A lower buffer layer MBF can also be arranged on the substrate SUB. The lower buffer layer MBF can prevent or reduce impurities such as hydrogen from flowing into the first active layer ACT through the substrate SUB. The lower buffer layer MBF can include an inorganic insulating material. For example, the lower buffer layer MBF can include an oxide-based insulating material such as silicon nitride (SiNx), silicon oxide SiOx, silicon oxynitride (SiOxNy) or aluminum oxide Al2O3. In addition, a barrier layer capable of blocking particle inflow can be further arranged between the substrate SUB and the lower buffer layer MBF. The barrier layer can be composed of a multi-barrier layer in which at least one organic insulating layer such as acrylic resin, epoxy resin, polyimide, polyethylene and silicon oxycarbide (SiOC) and at least one inorganic insulating layer are alternately laminated.

In addition, the driving transistor DT can include the first channel CH1, the first-first source/drain electrode SD 11 and the first-second source/drain electrode SD12 arranged in the first active layer ACT, and the first gate electrode GE1 overlapping the first channel CH1 in the third direction Z with a first gate insulating layer GI1 interposed therebetween. The light-emitting control transistor T6 can include the sixth channel CH6, the sixth-first source/drain electrode SD61, and the sixth-second source/drain electrode SD62 arranged in the first active layer ACT, and the sixth gate electrode GE6 overlapped in the third direction Z with the sixth channel CH6 and the first gate insulating layer GI1 interposed therebetween.

Further, the first-second source/drain electrode SD12 of the driving transistor DT and the sixth-first source/drain electrode SD61 of the light-emitting control transistor T6 can be connected through the first active layer ACT. The first gate electrode GE1 of the driving transistor DT can also be formed integrally with the first capacitor electrode C1 of the storage capacitor Cst.

In addition, the driving transistor DT can further include a dummy hole 124 penetrating a plurality of insulating layers including first and second upper buffer layers ABF1, ABF2, a second gate insulating layer GI2, and the interlayer insulating layer ILD stacked on the first gate electrode GE1, and the dummy electrode 126 disposed on the interlayer insulating layer ILD and connected to the first gate electrode GE1 through the dummy hole 124.

Also, the gate insulating layer GI1, GI2, upper buffer layer ABF1, ABF2, and interlayer insulating layer ILD can include inorganic insulating materials such as silicon oxide SiO2 and silicon nitride SiNx, silicon oxynitride SiOxNy etc. Further, the storage capacitor Cst can include the first capacitor electrode C1 connected to the first gate electrode GE1 of the driving transistor DT, and the second capacitor electrode C2 overlapping in the third direction Z with a first upper buffer layer ABF1 therebetween. A second upper buffer layer ABF2 can be disposed on the second capacitor electrode C2.

A sampling transistor T3 disposed on the second upper buffer layer ABF2 can also include the third channel CH3 of the second active layer OACT disposed on the second upper buffer layer ABF2, the third-first source/drain electrode SD 31 and the third-second source/drain electrode SD32, and the third gate electrode GE3 that overlaps the third channel CH3 in the third direction Z with the second gate insulating layer GI2 interposed therebetween. The sampling transistor T3 can further include the light-shielding electrode 112 that is disposed between the first and second upper buffer layers ABF1, ABF2 and overlaps the third channel CH3 of the second active layer OACT in the third direction Z.

Further, the interlayer insulating layer ILD can be disposed on the sampling transistor T3. In particular, the 3-1 source/drain electrode SD31 of the sampling transistor T3 can be connected to the connection electrode 106 disposed on the interlayer insulating layer ILD through a contact hole 68. Also, the 3-2 source/drain electrode SD32 of the sampling transistor T3 can be connected to the connection electrode 105 disposed on the interlayer insulating layer ILD through the contact hole 65, and the connection electrode 105 can be connected to the first capacitor electrode C1 through the contact hole 64. The gate electrode GE3 of the sampling transistor T3 can overlap the upper line 104 of the first gate line 31 in the third direction Z.

In addition, the first gate line 31 can include the lower line 103 on the second gate insulating layer GI2 and the upper line 104 disposed on the interlayer insulating layer ILD and overlapping the lower line 103 in the third direction Z. The 6-2 source/drain electrode SD 62 of the light-emitting control transistor T6 can be connected to the connection electrode 107 disposed on the interlayer insulating layer ILD through the contact hole 73.

Further, the connection electrode 107 of the light-emitting control transistor T6 can be connected to the connection electrode 92-3 disposed on a first planarization layer PLN1 through a contact hole 83-2 and to an anode electrode AE3 disposed on a second planarization layer PLN2 through a contact hole 84-3. The light-emitting element layer including the light-emitting element, a bank layer BK, and a spacer SP can be arranged on the second planarization layer PLN2.

As shown, the light emitting element can include the anode electrode AE3, a light emitting stack EML3, and a cathode electrode (second electrode) CE disposed on the second planarization layer PLN2. The anode electrode AE3 can be independently disposed for each subpixel. The anode electrode AE3 can also be formed of a plurality of conductive layer structures having high reflectivity. For example, the anode electrode AE3 can be formed of a stacked structure of aluminum Al and titanium Ti Ti/Al/Ti, a stacked structure of aluminum Al and indium tin oxide ITO (ITO/Al/ITO), a stacked structure of silver (Ag) and molybdenum/titanium alloy (Ag/MoTI) or a stacked structure of APC and ITO (ITO/APC/ITO), but is not limited thereto. APC is an alloy of silver Ag, palladium Pd, and copper Cu.

In addition, the anode electrode AE3 can have an opening that exposes the anode electrode AE3 on the second planarization layer PLN2 that is arranged, and the bank layer BK that covers an end of the anode electrode AE3 can be arranged. In particular, the opening of the bank layer BK can be defined as an emission area EA3, and an area where the bank layer BK is arranged can be defined as a non-emission area. The bank layer BK surrounding the emission area can be formed as a single-layer, double-layer or multi-layer structure. The spacer SP having an opening wider than the opening of the bank layer BK can be further arranged on the bank layer BK. The spacer SP can support a fine metal mask FMM, which is a deposition mask, when forming the emission stack EML3. The bank layer BK and the spacer SP can be formed of an organic insulating material such as acrylic resin, phenolic resin, polyimide resin, unsaturated polyester resin, polyamide resin, benzocyclobutene, polyphenylene resin, and polyphenylene sulfide resin. The bank layer BK can contain a light-blocking material to block light leakage between adjacent pixels and reduce or prevent external light reflection.

In addition, the luminescent stack EML3 can be formed by stacking a hole control layer, an emitting layer, and an electron control layer in that order or in the reverse order. The hole control layer can include at least a hole transport layer among a hole injection layer and a hole transport layer, and the electron control layer can include at least an electron transport layer among the electron transport layer and an electron injection layer.

Further, the cathode electrode CE can be a common electrode disposed on the light-emitting stack EML3 and connected along the surfaces of the bank layer BK and the spacer SP. The cathode electrode CE can be formed of a conductive material or a semi-transparent conductive material having high light transmittance. For example, the cathode electrode CE can be formed of a transparent conductive material such as ITO, IZO or ITZO. The cathode electrode CE can be formed of a semi-transparent metal material such as magnesium Mg, silver Ag or an alloy thereof. A capping layer can be further disposed on the cathode electrode CE to increase light resonance and light emission efficiency of the light-emitting element.

An encapsulating layer ENCAP is disposed on the light-emitting element layer to seal the light-emitting element layer, thereby preventing or reducing impurities such as moisture or oxygen from penetrating into the light-emitting element and covering particles to prevent or reduce flow. The encapsulating layer ENCAP can have a laminated structure of first and second inorganic encapsulating layers PAS1, PAS2 and an organic encapsulating layer PCL disposed between the first and second inorganic encapsulating layers PAS1, PAS2. The inorganic encapsulating layers PAS1, PAS2 can prevent or reduce impurities such as moisture or oxygen from penetrating from the outside. The organic encapsulating layer PCL can cover particles and serve to buffer stress between each layer when the display panel is bent.

Figure 10:
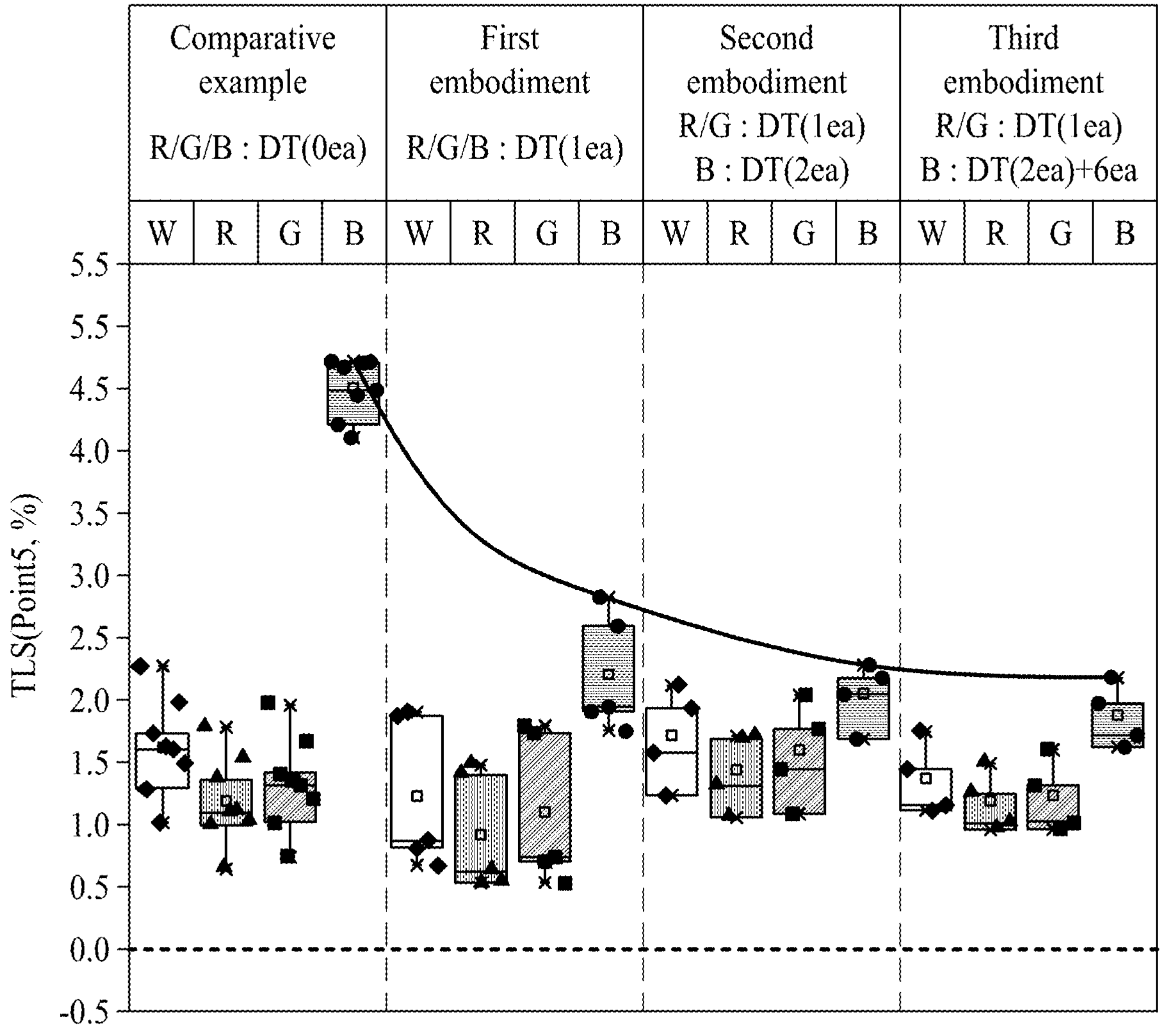
FIG. 10 is a graph comparing a temperature luminance sensitivity of display devices according to a comparative example and an embodiment of the present disclosure.
Figure 11:
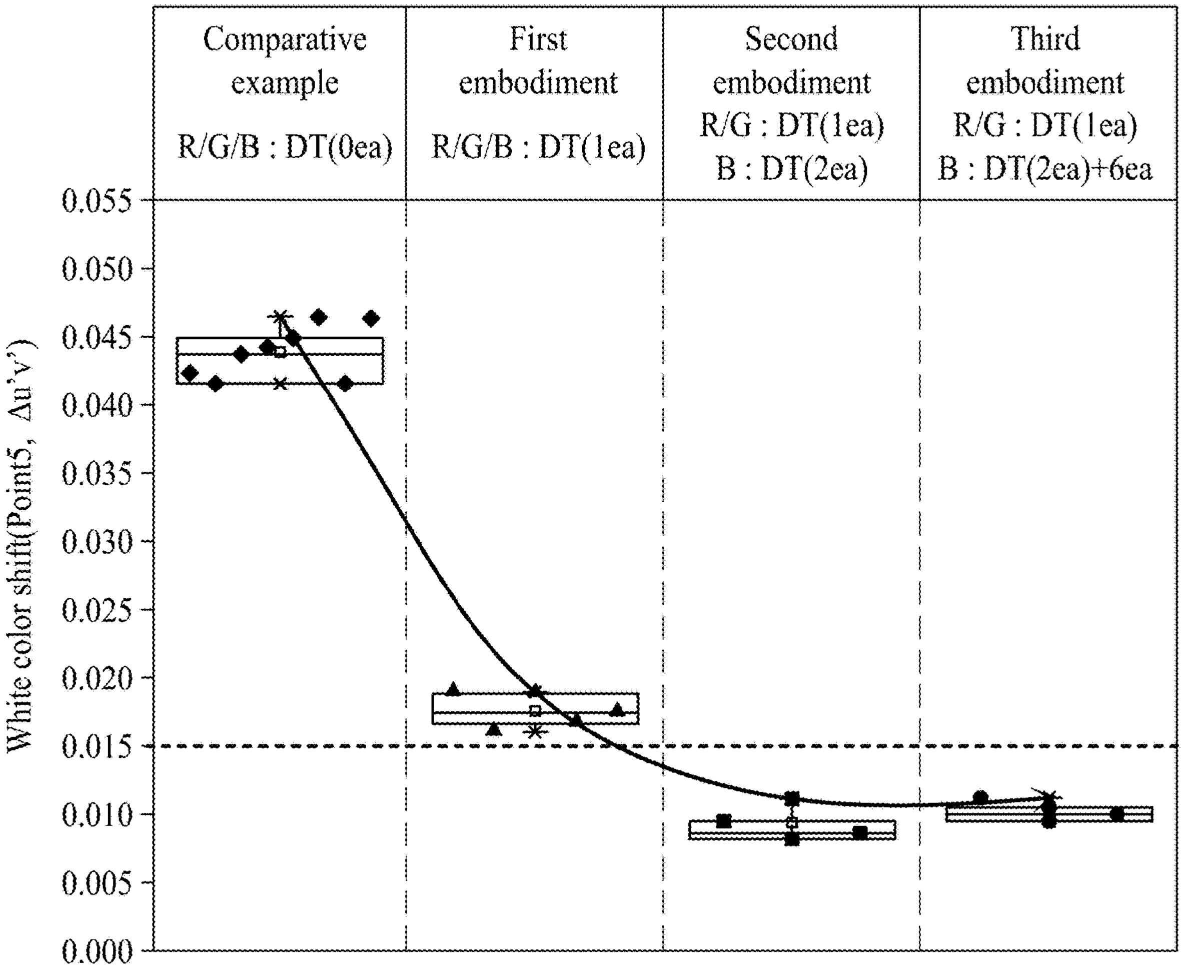
FIG. 11 is a graph comparing a temperature color sensitivity of display devices according to a comparative example and an embodiment of the present disclosure.

Next, FIG. 10 is a graph comparing the temperature luminance sensitivity of display devices according to a comparative example and one embodiment of the present disclosure, and FIG. 11 is a graph comparing the temperature color sensitivity of display devices according to a comparative example and an embodiment. In FIG. 10, the vertical axis represents the temperature luminance sensitivity TLS. In FIG. 11, the vertical axis represents the shift amount Δu'v' of the white color coordinates corresponding to the temperature color sensitivity TCS.

Referring to FIGS. 10 and 11, the display device according to a comparative example can include driving transistors DT without dummy holes for R/G/B subpixels, as in the comparative example illustrated in FIG. 8A. In the comparative example, the threshold voltage variation amount ΔVth depending on the temperature of the driving transistor DT of each R/G/B subpixel can be relatively low, such as about 7.7 mV/° C. Accordingly, in the display device according to the comparative example, it can be seen that the temperature luminance sensitivity TLS1.19, 1.34, and 4.50 of each R/G/B subpixel and the temperature luminance sensitivity TLS 1.62 of white light W are relatively high, and in particular, the temperature luminance sensitivity TLS of the B subpixel has a relatively high value 4.50, and the white color coordinate shift amount Δu'v'=0.044 is also relatively high.

Next, the display device according to the first embodiment can include the driving transistor DT having one dummy hole 120 for each of the R/G/B subpixels, as in the embodiment illustrated in FIG. 8B. In the first embodiment, the threshold voltage variation amount ΔVth depending on the temperature of the driving transistor DT of each of the R/G/B subpixels can increase to approximately 10.6 mV/° C., which is higher than the ΔVth 7.7 mV/° C. of the comparative example. Accordingly, it can be seen that the temperature luminance sensitivity TLS0.92, 1.10, and 2.20 of each of the R/G/B subpixels and the temperature luminance sensitivity TLS, 1.22 of white light W in the display device according to the first embodiment are reduced compared to the comparative example. In addition, it can be seen that in the display device according to the first embodiment, the difference between the temperature luminance sensitivity TLS 0.92 and 1.10 of the R/G subpixels and the temperature luminance sensitivity TLS 2.20 of the B subpixels is reduced, and the white color coordinate shift amount Δu'v'=0.018 is also reduced compared to Δu'v'=0.044 of the comparative example.

In the display device according to the second embodiment, the R/G subpixels can include the driving transistor DT having one dummy hole 120 as in the embodiment illustrated in FIG. 8B, and the B subpixel can include the driving transistor DT having two dummy holes 124 as in the embodiment illustrated in FIG. 8C. The temperature-dependent threshold voltage variation amount ΔVth of the driving transistor DT of the B subpixel can be approximately 11.5 mV/° C., which can be increased compared to ΔVth 7.7 mV/° C. of the comparative example and the temperature-dependent threshold voltage variation 10.6 mV/° C. of the driving transistor of the R/G subpixels. Accordingly, it can be seen that the temperature luminance sensitivity TLS 1.44, 1.59, 2.04 of each of the R/G/B subpixels and the temperature luminance sensitivity TLS 1.71 of white light W in the display device according to the second embodiment are reduced compared to the comparative example. In addition, it can be seen that in the display device according to the second embodiment, the difference between the temperature luminance sensitivity TLS 1.44, 1.59 of the R/G subpixels and the temperature luminance sensitivity TLS 2.04 of the B subpixels is reduced compared to the first embodiment, and the white color coordinate shift amount Δu'v'=0.009 is also reduced compared to Δu'v'=0.044 of the comparative example and Δu'v'=0.018 of the first embodiment.

Also, the display device according to a third embodiment can include the driving transistor DT having one dummy hole 120 for the R/G subpixels as in the embodiment illustrated in FIG. 8B, and a B subpixel can include the driving transistor DT having two dummy holes 124 as in the embodiment illustrated in FIG. 8D, and can further include six dummy holes 69*a*, 73*a*, 77 in a peripheral area of the driving transistor DT. The temperature-dependent threshold voltage variation amount ΔVth of the driving transistor DT of the B subpixel can be approximately 11.8 mV/° C., which can increase compared to the ΔVth 7.7 mV/° C. of the comparative example and the temperature-dependent threshold voltage variation 10.6 mV/° C. of the driving transistor of the R/G subpixel.

Accordingly, it can be seen that in the display device according to the third embodiment, the temperature luminance sensitivities TLS 1.18, 1.22, 1.87 of each of the R/G/B subpixels and the temperature luminance sensitivity TLS 1.36 of white light Ware reduced compared to the comparative example. In addition, it can be seen that in the display device according to the third embodiment, the difference between the temperature luminance sensitivities TLS1.18, 1.22 of the R/G subpixels and the temperature luminance sensitivity TLS 1.87 of the B subpixels is reduced compared to the first embodiment, and the white color coordinate shift amount Δu'v'=0.010 is also reduced compared to Δu'v'=0.044 of the comparative example Δu'v'=0.044 and Δu'v'=0.018 of the first embodiment.

Next, FIGS. 12A to 12D are drawings comparing white color coordinate changes according to temperature changes of display devices according to comparative examples and one embodiment of the present disclosure. In FIGS. 12A to 12D, the horizontal axis represents u' chromaticity, the vertical axis represents v' chromaticity, and the white color coordinates according to temperature in the u'v' chromaticity coordinate system are shown.

Figure 12A:
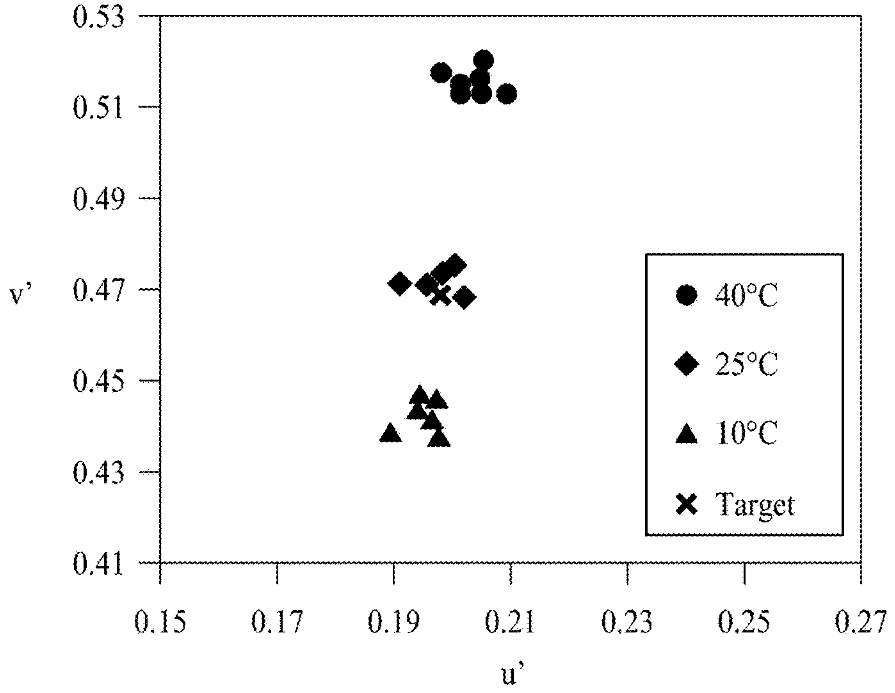
FIGS. 12A to 12D are overviews comparing white color coordinate changes according to temperature changes of display devices according to comparative examples and one embodiment of the present disclosure.

Referring to FIG. 12A, the display device according to a comparative example can include driving transistors DT without dummy holes for R/G/B subpixels, as in the comparative example illustrated in FIG. 8A, and the threshold voltage variation amount ΔVth of the driving transistors DT of each R/G/B subpixel depending on the temperature can be relatively low, such as about 7.7 mV/° C. Accordingly, in the display device according to the comparative example, the temperature luminance sensitivity TLS and the temperature chromatic sensitivity TCS of the R/G/B subpixels are relatively low, so that the white color coordinate variation range depending on the temperature variation is relatively large, and thus, it can be seen that the variation ranges of the white color coordinate at room temperature 20° C. and at high temperature 40° C. are also large, and the variation ranges of the white color coordinate at room temperature 20° C. and at low temperature 10° C. are also large.

Figure 12B:
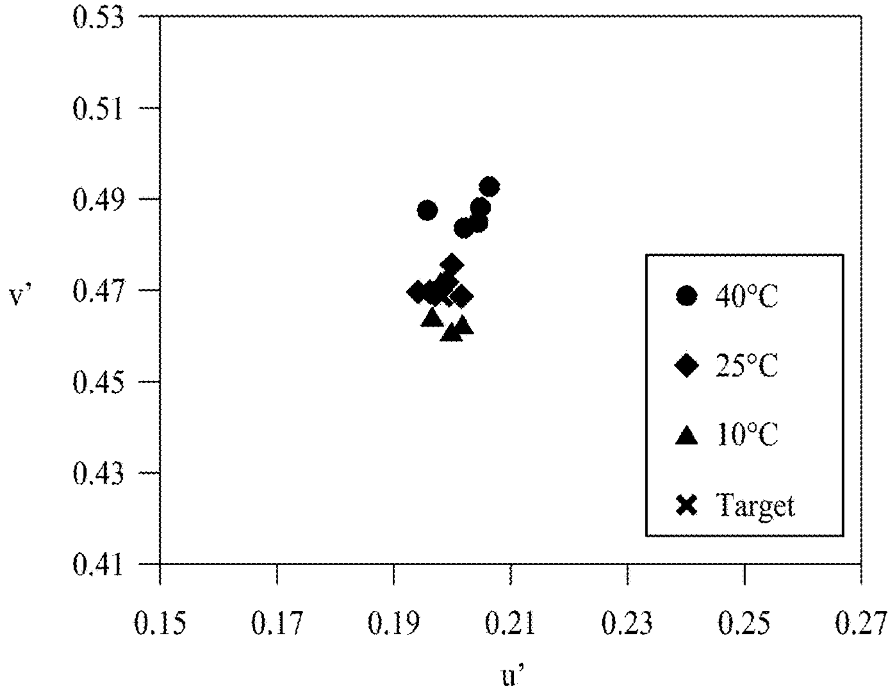

Referring to FIG. 12B, the display device according to the first embodiment can include the driving transistor DT having one dummy hole 120 for each of the R/G/B subpixels, as in the embodiment illustrated in FIG. 8*b*, and the threshold voltage variation amount ΔVth of the driving transistor DT of each of the R/G/B subpixels depending on the temperature can increase to approximately 10.6 mV/° C. compared to the ΔVth 7.7 mV/° C. of the comparative example. Accordingly, it can be seen that in the display device according to the first embodiment, the temperature luminance sensitivity TLS and the temperature color sensitivity TCS of the R/G/B subpixels are reduced compared to the comparative example in terms of the white color coordinate variation range depending on the temperature variation, and thus the variation range of the white color coordinate at room temperature 20° C. and at high temperature 40° C., and the variation range of the white color coordinate at room temperature 20° C. and at low temperature 10° C. are all reduced compared to the comparative example.

Figure 12C:
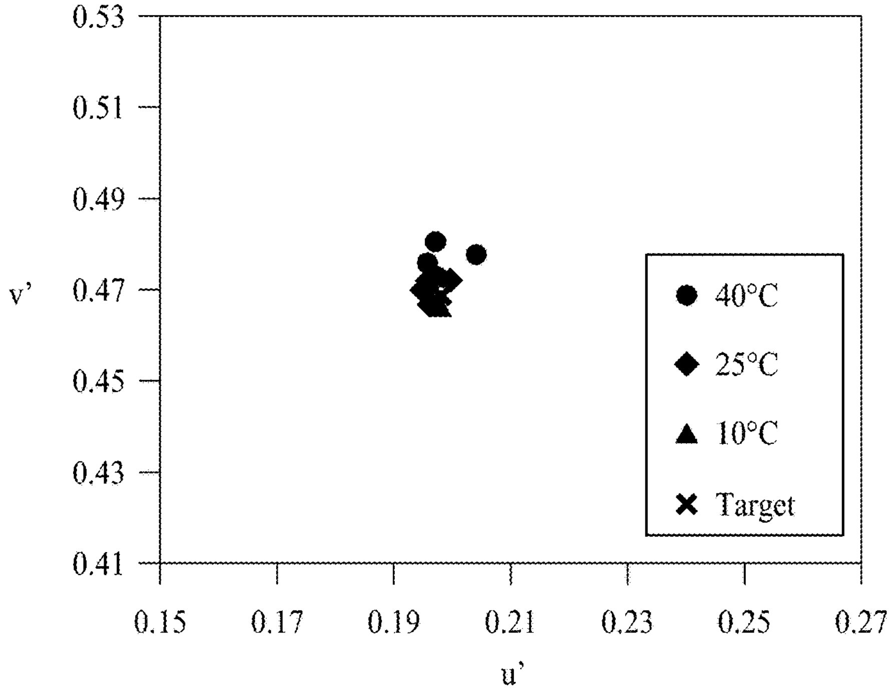

Referring to FIG. 12C, in the display device according to the first embodiment, the R/G subpixels can include the driving transistor DT having one dummy hole 120 as in the embodiment illustrated in FIG. 8B, and the B subpixel can include the driving transistor DT having two dummy holes 124 as in the embodiment illustrated in FIG. 8C. The temperature-dependent threshold voltage variation amount ΔVth of the driving transistor DT of the B subpixel can be approximately 11.5 mV/° C., which can increase compared to the ΔVth 7.7 mV/° C. of the comparative example and the temperature-dependent threshold voltage variation ΔVth 10.6 mV/° C. of the driving transistor of the R/G subpixel. Accordingly, in the display device according to the second embodiment, the temperature luminance sensitivity TLS and temperature chromatic sensitivity TCS of the R/G/B subpixels are reduced in the white color coordinate fluctuation range due to temperature change compared to the comparative example and the first embodiment, so that the fluctuation range of the white color coordinate at room temperature 20° C. and at high temperature 40° C. and the fluctuation range of the white color coordinate at room temperature 20° C. and at low temperature 10° C. are all reduced compared to the comparative example and the first embodiment.

Figure 12D:
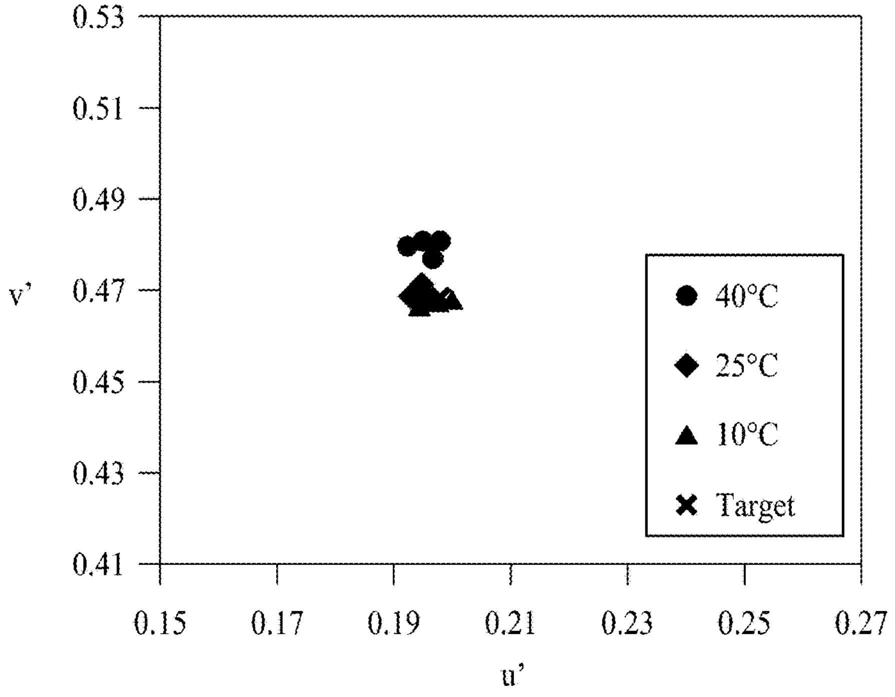

Referring to FIG. 12D, in a display device according to the third embodiment, the R/G subpixels can include the driving transistor DT having one dummy hole 120 as in the embodiment illustrated in FIG. 8*b*, and the B subpixel can include the driving transistor DT having two dummy holes 124 as in the embodiment illustrated in FIG. 8D and can further include six dummy holes 69*a*, 73*a*, 77 in a peripheral area of the driving transistor DT. The threshold voltage variation amount ΔVth of the driving transistor DT of the B subpixel depending on the temperature can be increased to approximately 11.8 mV/° C., which is higher than the ΔVth 7.7 mV/° C. of the comparative example and the threshold voltage variation ΔVth 10.6 mV/° C. of the driving transistor of the R/G subpixel depending on the temperature. Accordingly, in the display device according to the third embodiment, the temperature luminance sensitivity TLS and the temperature color sensitivity TCS of the R/G/B subpixels are reduced compared to the comparative example and the first embodiment, and thus it can be seen that the variation range of the white color coordinate at room temperature 20° C. and at high temperature 40° C., and the variation range of the white color coordinate at room temperature 20° C. and at low temperature 10° C. are all reduced compared to the comparative example and the first embodiment.

As described above, the display device according to one embodiment can reduce or minimize the temperature luminance sensitivity TLS and temperature color sensitivity TCS of subpixels by controlling the threshold voltage variation of the driving transistor according to temperature by applying the dummy hole to an insulating layer of the driving transistor.

In addition, the display device according to one embodiment can minimize the difference in luminance variation among subpixels due to temperature variations by differentially applying the number or area ratio of dummy holes in the insulating layer of the subpixels, based on the aperture ratio (area) of the light-emitting element or the luminance variation characteristics of the light-emitting element depending on temperature. As a result, the variation in white color coordinates due to temperature variation can be minimized, thereby improving optical quality."

Further, the display device according to one embodiment can control the threshold voltage variation of the driving transistor depending on temperature to reduce or minimize the temperature luminance sensitivity and temperature color sensitivity of the subpixels, thereby improving optical quality. As a result, it can provide improved image quality with lower power consumption.

As described above, the display device according to embodiments of the present disclosure can include a first subpixel including a first light-emitting element configured to emit light of a first color and a first driving transistor configured to drive the first light-emitting element, a second subpixel including a second light-emitting element configured to emit light of a second color and a second driving transistor configured to drive the second light-emitting element, at least one first dummy hole disposed in the first driving transistor, and at least one second dummy hole disposed in the second driving transistor, wherein a total aperture area of the at least one first dummy hole of the first driving transistor can be different than a total aperture area of the at least one second dummy hole of the second driving transistor.

In addition, the total aperture area of the at least one first dummy hole of the first driving transistor can be larger than the total aperture area of the at least one second dummy hole of the second driving transistor. Further, a number of the at least one first dummy hole of the first driving transistor can be greater than a number of the at least one second dummy hole of the second driving transistor. Also, the first subpixel can further include a peripheral dummy hole disposed on an insulating layer around the first driving transistor.

The display device according to some embodiments of the present disclosure can further include a third subpixel including a third light-emitting element configured to emit light of a third color and a third driving transistor configured to drive the third light-emitting element, and at least one third dummy hole disposed in the third driving transistor, wherein a total aperture area of the at least one third dummy hole of the third driving transistor can be the same as any one of the total aperture area of the first dummy hole of the first driving transistor and the total aperture area of the at least one second dummy hole of the second driving transistor, or can be different from the total aperture area of the at least one first dummy hole of the first driving transistor and the total aperture area of the at least one second dummy hole of the second driving transistor.

Also, the first driving transistor can further include a first dummy electrode connected to a gate electrode of the first driving transistor through the at least one first dummy hole. The second driving transistor can further include a second dummy electrode connected to a gate electrode of the second driving transistor through the at least one second dummy hole. The third driving transistor can further include a third dummy electrode connected to a gate electrode of the third driving transistor through the at least one third dummy hole.

In the display device according to some embodiments, at least one first dummy hole of the first driving transistor, the at least one second dummy hole of the second driving transistor and the at least one third dummy hole of the third driving transistor can be embedded by an upper insulating layer disposed above the first driving transistor, the second driving transistor, and the third driving transistor.

Further, each of the first, second, and third subpixels can further include at least one contact hole. An aperture area of each of the at least one first, the at least one second and the at least one third dummy holes of the first, second, and third subpixels can be the same as an aperture area of each of the at least one contact holes in the first, second, and third subpixels.

In the display device according to some embodiments, the first subpixel can be a blue subpixel, the second subpixel can be a green subpixel, and the third subpixel can be a red subpixel. The total aperture area of the at least one first dummy hole of the first driving transistor in the blue subpixel can be larger than the total aperture area of the at least one second dummy hole of the second driving transistor in the green subpixel, and be larger than the total aperture area of the at least one third dummy hole of the third driving transistor in the red subpixel. The total aperture area of the at least one second dummy hole of the second driving transistor can be the same as the total aperture area of the at least one third dummy hole of the third driving transistor.

In the display device according to some embodiments, the first subpixel can be a blue subpixel, the second subpixel can be a green subpixel, and the third subpixel can be a red subpixel. A number of the at least one first dummy hole of the first driving transistor in the blue subpixel can be greater than a number of the at least one second dummy hole of the second driving transistor in the green subpixel, and be greater than a number of the at least one third dummy hole of the third driving transistor in the red subpixel. The number of the at least one second dummy hole of the second driving transistor can be the same as the number of the at least one third dummy hole of the third driving transistor.

A display device according to some embodiments of the present disclosure can include a first subpixel including a first light-emitting element configured to emit light of a first color, a first driving transistor configured to drive the first light-emitting element, and at least one first dummy hole overlapping a first gate electrode of the first driving transistor, a second subpixel including a second light-emitting element configured to emit light of a second color, a second driving transistor configured to drive the second light-emitting element, and at least one second dummy hole overlapping a second gate electrode of the second driving transistor, and a third subpixel including a third light-emitting element configured to emit light of a third color, a third driving transistor configured to drive the third light-emitting element, and at least one third dummy hole overlapping a third gate electrode of the third driving transistor.

Also, a total aperture area of the at least one first dummy hole can have a different area ratio from each of a total aperture area of the at least one second dummy hole and a total aperture area of the at least one third dummy hole, and the total aperture area of the at least one second dummy hole can be the same as or different from the total aperture area of the at least one third dummy hole.

Also, a number of the at least one first dummy hole of the first driving transistor can be larger than a number of the at least one second dummy hole of the second driving transistor, and be larger than a number of the at least one third dummy hole of the third driving transistor. A total aperture area of the at least one first dummy hole of the first driving transistor can be larger than a total aperture area of the at least one second dummy hole of the second driving transistor, and be larger than a total aperture area of the at least one third dummy hole of the third driving transistor. A total aperture area or a number of the at least one second dummy hole of the second driving transistor can be the same as a total aperture area or a number of the at least one third dummy hole of the third driving transistor.

In addition, each of the first, second, and third subpixels further can include at least one contact hole disposed in a plurality of insulating layers, and an aperture area of each of the at least one first dummy hole of the first subpixel, the at least one second dummy hole of the second subpixel and the at least one third dummy hole of the third subpixel can be the same as an aperture area of each of the at least one contact hole.

The display device according to embodiments of the present disclosure can further include a first dummy electrode connected to the first gate electrode through the at least one first dummy hole of the first driving transistor, a second dummy electrode connected to the second gate electrode through the at least one second dummy hole of the second driving transistor, and a third dummy electrode connected to the third gate electrode through the at least one third dummy hole of the third driving transistor, wherein an area of the first dummy electrode can be different from an area of the second dummy electrode and an area of the third dummy electrode, and wherein the area of the second dummy electrode can be the same as or different from the area of the third dummy electrode.

Also, the at least one first, the at least one second and the at least one third dummy holes can be embedded by an upper insulating layer above the first gate electrode of the first driving transistor, the second gate electrode of the second driving transistor, and the third gate electrode of the third driving transistor. Further, the first subpixel further can include a plurality of peripheral dummy holes disposed on a plurality of insulating layers around the first driving transistor.

In addition, an aperture area of each of the first, second, and third light-emitting elements can be different from each other. In the display device according to some embodiments, a luminance variation characteristic depending on a temperature of each of the first, second, and third light-emitting elements can be different from each other.

As described above, a threshold voltage variation amount depending on temperature of the first driving transistor can be different from a threshold voltage variation amount depending on temperature of the second driving transistor and a threshold voltage variation amount depending on temperature of the third driving transistor, and the threshold voltage variation amount depending on temperature of the second driving transistor can be the same or different from the threshold voltage variation amount depending on temperature of the third driving transistor.

Further, each of the first, second, and third subpixels can further include a plurality of transistors connected to each of the first, second, and third driving transistors, and the first, second, and third driving transistors and the plurality of transistors can include an active layer of at least one of a polysilicon semiconductor layer and an oxide semiconductor layer.

In each of the first, second, and third subpixels, at least one of the plurality of transistors and the first, second, and third driving transistors can be polysilicon transistors including a polysilicon semiconductor layer. At least another one of the plurality of transistors can be an oxide transistor including an oxide semiconductor layer. The oxide transistor can be disposed on at least one lower insulating layer disposed on the polysilicon transistor. Each of the at least one first, the at least one second, and the at least one third dummy hole can be formed through at least one insulating layer of the polysilicon transistor, the at least one lower insulating layer on the polysilicon transistor, and at least one upper insulating layer on the oxide transistor.

Further, the first driving transistor can further include a first dummy electrode connected to the first gate electrode through the at least one first dummy hole, the second driving transistor can further include a second dummy electrode connected to the second gate electrode through the at least one second dummy hole, the third driving transistor can further include a third dummy electrode connected to the third gate electrode through the at least one third dummy hole, and wherein the first, second, and third dummy electrodes are disposed on the at least one upper insulating layer on the oxide transistor.

A display device according to embodiments of the present disclosure can include a first subpixel including a first light-emitting element configured to emit light of a first color, a first driving transistor configured to drive the first light-emitting element, and at least one first dummy hole overlapping the first driving transistor, and a second subpixel including a second light-emitting element configured to emit light of a second color, a second driving transistor configured to drive the second light-emitting element, and at least one second dummy hole overlapping the second driving transistor, wherein the first driving transistor and the second driving transistor have different dummy hole total aperture areas depending on the temperature dependent luminance variation characteristics of the first light-emitting element and the second light-emitting element.

Further, the first driving transistor and the second driving transistor can have different dummy hole total aperture areas depending on the aperture areas of the first light-emitting element and the second light-emitting element.

The display device according to one or more embodiments of the present disclosure can be applied to various electronic devices. For example, the display device can be applied to a mobile device, a video phone, a smart watch, a watch phone, a wearable device, a foldable device, a rollable device, a bendable device, a flexible device, a curved device, an electronic diary, electronic book, a portable multimedia player (PMP), a personal digital assistant (PDA), MP3 player, a mobile medical device, a desktop PC, a laptop PC, a netbook computer, a workstation, a navigator, a vehicle navigator, a vehicle display device, a television, a wall paper display device, a signage device, a game device, a notebook computer, a monitor, a camera, a camcorder, and home appliances.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various substitutions, modifications, and variations are possible within the scope of the present disclosure without departing from the spirit and scope of the present disclosure. Therefore, the scope of the present disclosure includes those represented by the following claims, and all changes or modifications derived from the meaning, range and equivalent concept of the claims should be interpreted as being included in the scope of the present disclosure.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:

a first subpixel including a first light-emitting element configured to emit light of a first color and a first driving transistor configured to drive the first light-emitting element;

a second subpixel including a second light-emitting element configured to emit light of a second color and a second driving transistor configured to drive the second light-emitting element, at least one first dummy hole disposed in the first driving transistor; and at least one second dummy hole disposed in the second driving transistor, wherein a total aperture area of the at least one first dummy hole of the first driving transistor is different than a total aperture area of the at least one second dummy hole of the second driving transistor, wherein each light-emitting element includes at least one electrode, wherein each driving transistor includes an active layer, a gate insulation layer disposed on the active layer, and a gate electrode disposed on the gate insulation layer, and wherein each dummy hole penetrates an insulating layer covering a transistor to expose a portion of a respective gate electrode.

2. The display device of claim 1, wherein the total aperture area of the at least one first dummy hole of the first driving transistor is larger than the total aperture area of the at least one second dummy hole of the second driving transistor.

3. The display device of claim 1, wherein a number of the at least one first dummy hole of the first driving transistor is greater than a number of the at least one second dummy hole of the second driving transistor.

4. The display device of claim 1, wherein the first subpixel further includes at least one peripheral dummy hole disposed in an insulating layer around the first driving transistor.

5. The display device of claim 1, further comprising:

a third subpixel including a third light-emitting element configured to emit light of a third color and a third driving transistor configured to drive the third light-emitting element; and at least one third dummy hole disposed in the third driving transistor, wherein a total aperture area of the at least one third dummy hole of the third driving transistor is the same as any one of the total aperture area of the first dummy hole of the first driving transistor and the total aperture area of the at least one second dummy hole of the second driving transistor, or is different from the total aperture area of the at least one first dummy hole of the first driving transistor and the total aperture area of the at least one second dummy hole of the second driving transistor.

6. The display device of claim 5, wherein the first driving transistor further includes a first dummy electrode connected to a gate electrode of the first driving transistor through the at least one first dummy hole, wherein the second driving transistor further includes a second dummy electrode connected to a gate electrode of the second driving transistor through the at least one second dummy hole, and wherein the third driving transistor further includes a third dummy electrode connected to a gate electrode of the third driving transistor through the at least one third dummy hole.

7. The display device of claim 5, wherein each of the first, second, and third subpixels further includes at least one contact hole, and wherein an aperture area of each of the at least one first, the at least one second, and the at least one third dummy holes of the first, second, and third subpixels is the same as an aperture area of each of the at least one contact hole in the first, second, and third subpixels.

8. The display device of claim 5, wherein the first subpixel is a blue subpixel, the second subpixel is a green subpixel, and the third subpixel is a red subpixel, wherein the total aperture area of the at least one first dummy hole of the first driving transistor in the blue subpixel is larger than the total aperture area of the at least one second dummy hole of the second driving transistor in the green subpixel, and is larger than the total aperture area of the at least one third dummy hole of the third driving transistor in the red subpixel, and wherein the total aperture area of the at least one second dummy hole of the second driving transistor is the same as the total aperture area of the at least one third dummy hole of the third driving transistor.

9. The display device of claim 5, wherein the first subpixel is a blue subpixel, the second subpixel is a green subpixel, and the third subpixel is a red subpixel, wherein a number of the at least one first dummy hole of the first driving transistor in the blue subpixel is greater than a number of the at least one second dummy hole of the second driving transistor in the green subpixel, and is greater than a number of the at least one third dummy hole of the third driving transistor in the red subpixel, and wherein the number of the at least one second dummy hole of the second driving transistor is the same as the number of the at least one third dummy hole of the third driving transistor.

10. The display device of claim 1, further comprising second insulating layer disposed on the insulating layer covering the transistor, wherein a portion of the second insulating layer is disposed in the dummy hole.

11. The display device of claim 1, further comprising second insulating layer disposed on the insulating layer covering the transistor, wherein a portion of the second insulating layer is disposed in the dummy hole to contact the gate electrode.

12. The display device of claim 1, wherein the insulating layer covering the transistor includes an inorganic insulating material.

13. The display device of claim 12, wherein the insulating layer covering the transistor includes at least one of silicon oxide SiO2 and silicon nitride SiNx, silicon oxynitride SiOxNy.

14. The display device of claim 12, wherein the gate insulating layer includes at least one of silicon oxide SiO2 and silicon nitride SiNx, silicon oxynitride SiOxNy.

15. The display device of claim 1, further comprising:

at least one planarization layer disposed on and covering the first driving transistor and the second driving transistor, and a bank layer disposed on and covering the at least one planarization layer.

16. A display device comprising:

a first subpixel including a first light-emitting element configured to emit light of a first color and a first driving transistor configured to drive the first light-emitting element;

a second subpixel including a second light-emitting element configured to emit light of a second color and a second driving transistor configured to drive the second light-emitting element, a third subpixel including a third light-emitting element configured to emit light of a third color and a third driving transistor configured to drive the third light-emitting element;

at least one first dummy hole disposed in the first driving transistor; and at least one second dummy hole disposed in the second driving transistor; and at least one third dummy hole disposed in the third driving transistor, wherein a total aperture area of the at least one first dummy hole of the first driving transistor is different than a total aperture area of the at least one second dummy hole of the second driving transistor, and wherein a total aperture area of the at least one third dummy hole of the third driving transistor is the same as any one of the total aperture area of the first dummy hole of the first driving transistor and the total aperture area of the at least one second dummy hole of the second driving transistor, or is different from the total aperture area of the at least one first dummy hole of the first driving transistor and the total aperture area of the at least one second dummy hole of the second driving transistor.

17. The display device of claim 16, wherein each driving transistor includes an active layer, and a gate electrode disposed on the active layer, and wherein each dummy hole penetrates an insulating layer covering a transistor to expose a portion of a respective gate electrode.

18. The display device of claim 17, further comprising second insulating layer disposed on the insulating layer covering the transistor, wherein a portion of the second insulating layer is disposed in the dummy hole to contact the gate electrode.

19. The display device of claim 18, wherein the insulating layer covering the transistor includes an inorganic insulating material.

* * * * *